(12) United States Patent
Ota

(10) Patent No.: US 6,549,270 B1
(45) Date of Patent: Apr. 15, 2003

(54) EXPOSURE APPARATUS, EXPOSURE METHOD AND METHOD FOR MANUFACTURING DEVICES

(75) Inventor: Kazuya Ota, Chiyoda-ku (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/533,546

(22) Filed: Mar. 23, 2000

(30) Foreign Application Priority Data

Mar. 31, 1999 (JP) .......................................... 11-094315

(51) Int. Cl.$^7$ ........................ G03B 27/42; G03B 27/52; G03B 27/34; G03B 27/70
(52) U.S. Cl. ............................ 355/55; 355/53; 355/57; 355/60; 355/66
(58) Field of Search ............................ 355/43, 45, 49, 355/51, 52, 53, 55, 57, 60, 66, 67; 356/450, 496, 498, 499, 513, 521; 378/34, 35; 359/843, 846, 856, 857

(56) References Cited

U.S. PATENT DOCUMENTS

| | | | | | |
|---|---|---|---|---|---|
| 5,835,217 | A | * | 11/1998 | Medecki | 356/521 |
| 5,900,926 | A | * | 5/1999 | Kato | 250/548 |
| 6,014,421 | A | * | 1/2000 | Chiba et al. | 378/34 |
| 6,142,641 | A | * | 11/2000 | Cohen et al. | 359/731 |
| 6,333,961 | B1 | * | 12/2001 | Murakami | 378/34 |

* cited by examiner

Primary Examiner—Rodney Fuller
(74) Attorney, Agent, or Firm—Oliff & Berridge, PLC

(57) ABSTRACT

In this exposure apparatus, position information such as the position, inclination, or shape of a first mirror, a second mirror, a third mirror, and a fourth mirror constituting a projection optical system PO is measured with a mirror monitor mechanism. Based on the obtained position information, the position or inclination or shape or the like of the first mirror, the second mirror, the third mirror, and the fourth mirror is corrected by actuators serving as a correction mechanism. As a result, in the case where changes occur in the projection optical system, these can be corrected in order to maintain the exposure conditions.

87 Claims, 9 Drawing Sheets

EXPOSURE APPARATUS, EXPOSURE METHOD AND METHOD FOR MANUFACTURING DEVICES

BACKGROUND OF THE INVENTION

1. Field of the Invention

The present invention relates to an exposure apparatus and an exposure method, and in particular relates to an exposure apparatus, an exposure method and a method for manufacturing devices, which are used at the time of manufacturing circuit devices for semiconductor elements or liquid crystal display elements and the like using a lithography process.

2. Description of the Related Art

At present, in manufacturing factory for semiconductor devices, circuit devices (64 megabit D-RAM and the like) with a minimum line width of around 0.3 to 0.35 µm are being mass produced using a reducing projection exposure apparatus, namely a so called stepper, with i-line of a mercury vapor lamp of 365 nm wavelength as the illumination light. At the same time, the introduction of exposure apparatus for mass production manufacture of next generation circuit devices with minimum line widths of less than 0.25 µm, having integration of the 256 megabit or 1 gigabit bit D-RAM class, has commenced.

As the exposure apparatus used in next generation circuit device manufacture, development is being carried out of a step-and-scan type scanning exposure apparatus, with ultraviolet pulse laser radiation of 248 nm wavelengths from a KrF excimer laser light source, or ultraviolet pulse laser radiation of 193 nm wavelengths from an ArF excimer laser light source as the illumination light. In the step-and-scan type scanning exposure apparatus, a scanning exposure operation and an inter-shot stepping operation are repeated, and at the time of scanning, a mask or reticle (hereunder referred to as "reticle") on which a circuit pattern is drawn, and a wafer serving as a photosensitive substrate are one dimensionally scanned relatively with respect to a projection field of a reducing projection optical system. As a result, the whole of the circuit pattern of the reticle is transferred to inside one shot region on the wafer.

However, the integration of semiconductor devices is moving prospectively to even higher integration of from 1 gigabit to 4 gigabits. The device rule in this case become 0.1 µm, that is around 100 nmL/S, and to correspond to this with an exposure apparatus using ultraviolet pulse laser radiation of the aforementioned 193 nm wavelength as the exposure light, there are numerous technical problems.

Recently, the development of an EUV exposure apparatus which uses radiation of the soft X-ray region of 5 to 15 nm wavelength (referred to in the specification of this invention as "EUV (Extreme Ultra Violet) radiation") is starting to be reached. This EUV exposure apparatus is gaining attention as an effective candidate for next generation exposure apparatus for minimum line widths, where for example with a line-and-space-pattern the pitch thereof is from 100 nm to 70 nm.

However, in such an EUV exposure apparatus, the projection optical system thereof comprises only reflecting type optical elements (mirrors). With such optical elements, the reflectivity is around 60 to 70%. Consequently, the optical elements are heated by the remaining 30 to 40% of energy. If the optical elements are heated, then deformation such as positional displacement and curvature change occur in the reflecting surface due to this, so that the projection optical system changes, resulting in the problem that an adverse effect is exerted on the exposure characteristics.

To address such a problem, cooling by convection of air cannot be hoped for since the projection optical system is in a vacuum. Consequently, conventionally a cooling mechanism is arranged on the attachment part or the rear side or the like of the optical elements, to cool the optical elements and thus suppress changes in the projection optical system.

However, this countermeasure is only for suppressing changes in the respective optical elements constituting the projection optical system, and it is not addressed to correction should a change once occur.

Moreover, in the EUV exposure apparatus, because the illumination optical system is constructed only from a plurality of reflecting type optical elements, there is the risk that a drop in optical characteristics of the illumination optical system may occur due to a change in the reflection surface of the optical elements.

SUMMARY OF THE INVENTION.

It is an object of the present invention to provide an exposure apparatus and exposure method which, even if a change occur in a projection optical system and/or an illumination optical system, can correct the change in order to maintain superior exposure characteristics. It is also an object of the present invention to provide a device manufacturing method which can manufacture stabilized high quality devices using the above exposure apparatus and exposure method.

In order to achieve the abovementioned objects, the exposure apparatus of the present invention is an exposure apparatus which illuminates a pattern formed on a mask with exposure light to transfer the pattern onto a substrate by way of a projection optical system. The projection optical system has at least one reflection type optical element, and is provided with a detection device that detects position information at an irradiation position of the exposure light on the reflection type optical element, and a correction device that corrects the optical element based on the position information.

In the exposure apparatus of the present invention, by detecting with the detection device the irradiation position of the exposure light on the reflection type optical element which constitutes the projection optical system, then position information such as the position, inclination, and deformation of the reflection type optical element can be obtained. Then based on this position information, the position, inclination, deformation and the like of the optical element is corrected with the correction device, thereby enabling the optical element to be corrected to a correct condition. Consequently, even in the case where for example due to heat or the like, the respective optical elements constituting the projection optical system change, these can be corrected. Hence the inherent exposure characteristics can be maintained enabling stabilized exposure to be performed.

In another aspect of the present invention, the detection device detects position information at a plurality of positions with respect to a single reflection type optical element. Therefore, position information for the inclination, deformation or the like of the optical element can also be obtained, and higher accuracy correction is possible.

In another aspect of the present invention, the mask is a reflecting type. Furthermore, in another aspect of the present invention, the exposure light is extreme ultraviolet (EUV)

light, and the optical elements which constitute the projection optical system are all reflection type optical elements. As a result, EUV radiation can be used as the exposure light, and high accuracy transfer of extremely fine patterns, for example of fine L/S patterns of from 100 nm to below this, or isolated patterns of 70 nm or below this, are possible. By providing the change correction function of the projection optical system in this exposure apparatus, performance maintenance thereof can be easily affected.

In another aspect of the present invention, an interferometer is provided as the detection device. Hence the position change of the optical element can be measured without requiring contact.

Furthermore, in another aspect of the present invention, the measuring beam of the interferometer is irradiated orthogonal to a reflection surface of the optical element. As a result, position information for the same place as the irradiated position of the illumination light on the optical element can be measured with the interferometer. Hence high accuracy measurement can be performed. Moreover, by irradiating the measuring beam orthogonal to the reflection face of the optical element, the number of turn up mirrors or the like positioned on the optical path of the measuring beam can be kept to a minimum. Furthermore, if turn up mirrors are provided on a single base member together with reference mirrors for a reference beam, then measurement of changes in the relation of the relative positions of the plurality of reflection type optical elements constituting the projection optical system can be assured.

Another aspect of the present invention comprises, as the correction device, an actuator that corrects a position or shape or the like of the optical element. In this way, by driving an actuator such as a piezo element or the like to apply a required stress to the optical element, the movement, attitude, shape or the like of the optical element can be corrected by a required dimension.

Another aspect of the present invention further comprises a movable body arranged on an image surface side of the projection optical system, and a measuring device that measures the optical characteristics of the projection optical system, and the measuring device comprises a light receiving face which detects the exposure light and arranged on the movable body. Furthermore, the movable body may be a substrate stage. The measuring device may be a device for measuring at least the wave front aberration of the optical characteristics of the projection optical system. Moreover, the measuring device may have a point-diffraction interferometer.

If the optical characteristics of the projection optical system are measured periodically with the measuring device, then the residual error of the optical characteristics which cannot be corrected by the adjustment of the optical elements by means of the correction device only, can be detected. Then based on the detection result, the optical elements can be adjusted by the correction device and the residual error can be corrected.

Another aspect of the present invention further comprises a stage system which relatively moves the substrate with respect to the irradiating exposure light while relatively moving the mask with respect to the exposure light in a synchronous manner, to thereby scan expose the substrate with the exposure light. In this case, in the step-and-scan type exposure apparatus, the aforementioned affect can be obtained.

Another aspect of the present invention is an exposure method where a pattern formed on a mask is illuminated with exposure light and transferred onto a substrate by way of a projection optical system incorporating at least one reflection type optical element. The position information regarding an irradiation position of the exposure light on the reflection type optical element is detected by a detection device, and the optical element is corrected by a correction device based on the position information.

According to such an exposure apparatus and exposure method, by detecting with the detection device the irradiation position of the exposure light on the reflection type optical element which constitutes the projection optical system, then position information such as the position, inclination, and deformation of the reflection type optical element can be obtained. Then based on this position information, the position, inclination, deformation and the like of the optical element is corrected with the correction device, thereby enabling the optical element to be corrected to a correct condition.

Another aspect of the present invention detects the irradiation position of the exposure light on the reflection type optical element constituting the projection optical system by the detection device. As a result, the position information such as the position, inclination, and deformation of the reflection type optical element can be obtained. Then based on this position information, the position, inclination, deformation and the like of the optical element can be corrected with the correction device. Hence the optical element can be corrected to a correct condition. Consequently, even in the case where for example due to heat or the like, the respective optical elements constituting the projection optical system change, these can be corrected. Hence the inherent exposure characteristics can be maintained enabling stabilized exposure to be performed.

In another aspect of the present invention, wave front aberration of the transmission light of the projection optical system is detected by an aberration detection device, and the optical element corrected based on the detection result. If this correction of the transmission light by wave front aberration detection is carried out for example at the time of installing the exposure apparatus, then assurance of the exposure performance at the initial state can be obtained. In addition, by performing at appropriate intervals the correction of the reflection type optical element using the position information, maintenance of the exposure performance is facilitated.

A device manufacturing method of another aspect of the present invention includes a step for transferring a device pattern onto a photosensitive substrate using the aforementioned exposure apparatus. By manufacturing a device with such an exposure apparatus, the device pattern is transferred onto the photosensitive substrate in a condition with the intrinsic exposure performance of the projection optical system maintained. Consequently, devices of a predetermined quality can be stably manufactured.

BRIEF DESCRIPTION OF THE DRAWINGS

FIG. 8A is a plan view showing an space image measuring instrument, while

DESCRIPTION OF THE PREFERRED EMBODIMENTS

Hereunder is a description of an example of embodiments of an exposure apparatus, an exposure method and a device manufacturing method according to the present invention with reference to FIG. 1 through FIG. 9.

Figure 1:
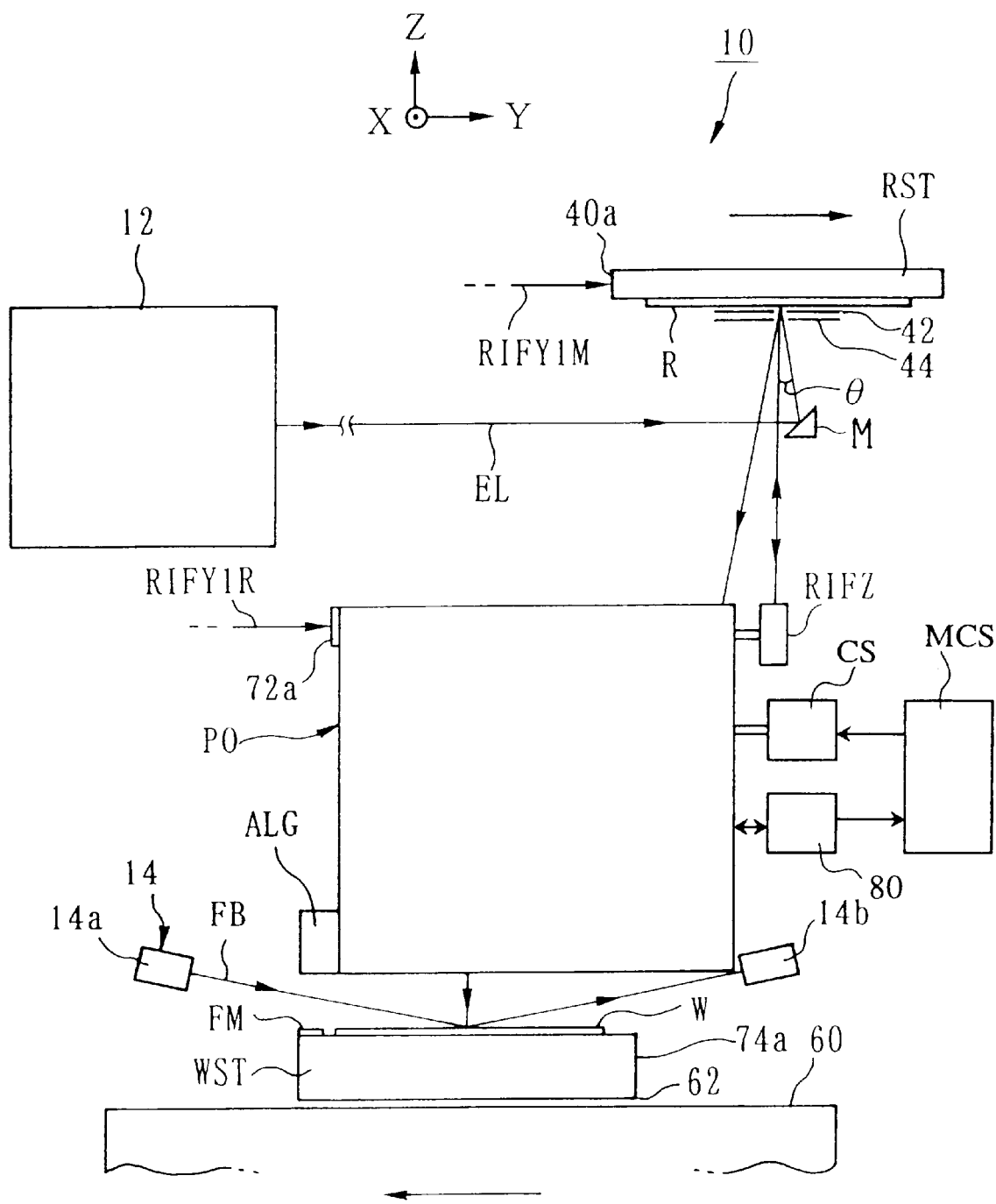
FIG. 1 is a diagram schematically showing an exposure apparatus of an embodiment of an exposure apparatus, an exposure method and a device manufacturing method according to the present invention.

FIG. 1 schematically shows the overall construction of an exposure apparatus 10 according to an aspect of the present embodiment. The exposure apparatus 10 is a projection exposure apparatus which uses as exposure light, EUV radiation (exposure light) EL in the soft X-ray region of 5 to 15 nm wavelength, for example radiation of 13.4 nm or 11.5 nm wavelength, to perform an exposure operation by the step-and-scan method. In this embodiment, as described later, a projection optical system PO is used for projecting a reflected optical flux from a reticle R serving as a mask, onto a wafer W (substrate, photosensitive substrate) so that the principal beam is incident substantially perpendicular onto the wafer W (that is to say, so that on the image surface side, the principal beam is substantially parallel with the optical axis). Hereunder, the projection direction of the EUV radiation EL from the projection optical system PO to the wafer W is referred to as the optical axis direction of the projection optical system PO. Moreover, this optical axis direction is described as the Z-axis direction, a direction within a plane orthogonal to this direction and within the surface of the page in FIG. 1 as the Y-direction, and a direction orthogonal to the surface of the page as the X-direction.

In this exposure apparatus 10, the image of a part of a circuit pattern drawn on the reflecting type reticle R serving as the mask, is projected onto the wafer W serving as the substrate, via the projection optical system PO, while the reticle R and the wafer W are relatively scanned in a one dimensional direction (here the Y-direction) with respect to the projection optical system PO. As a result, the whole of the circuit pattern of the reticle R is transferred by a step-and-scan method to each of a plurality of shot regions on the wafer W.

The exposure apparatus 10 comprises: a light source apparatus 12 for emitting EUV radiation EL parallel with the Y-direction; a turn up mirror M (one part of the illumination optical system) for reflecting the EUV radiation EL from the light source apparatus 12 and turning this so as to be incident on the pattern surface (lower surface in FIG. 1) of the reticle R at a predetermined incidental angle θ (here θ is approximately 50 mrad); a reticle stage (stage system) RST for holding the reticle R; a projection optical system PO comprising a reflection optical system for projecting the EUV radiation EL reflected by the pattern surface of the reticle R perpendicular to the surface to be exposed of the wafer W; a wafer stage (movable body, substrate stage, stage system) WST for holding the wafer W; focus sensors (14a, 14b); and an alignment optical system ALG.

Figure 2:
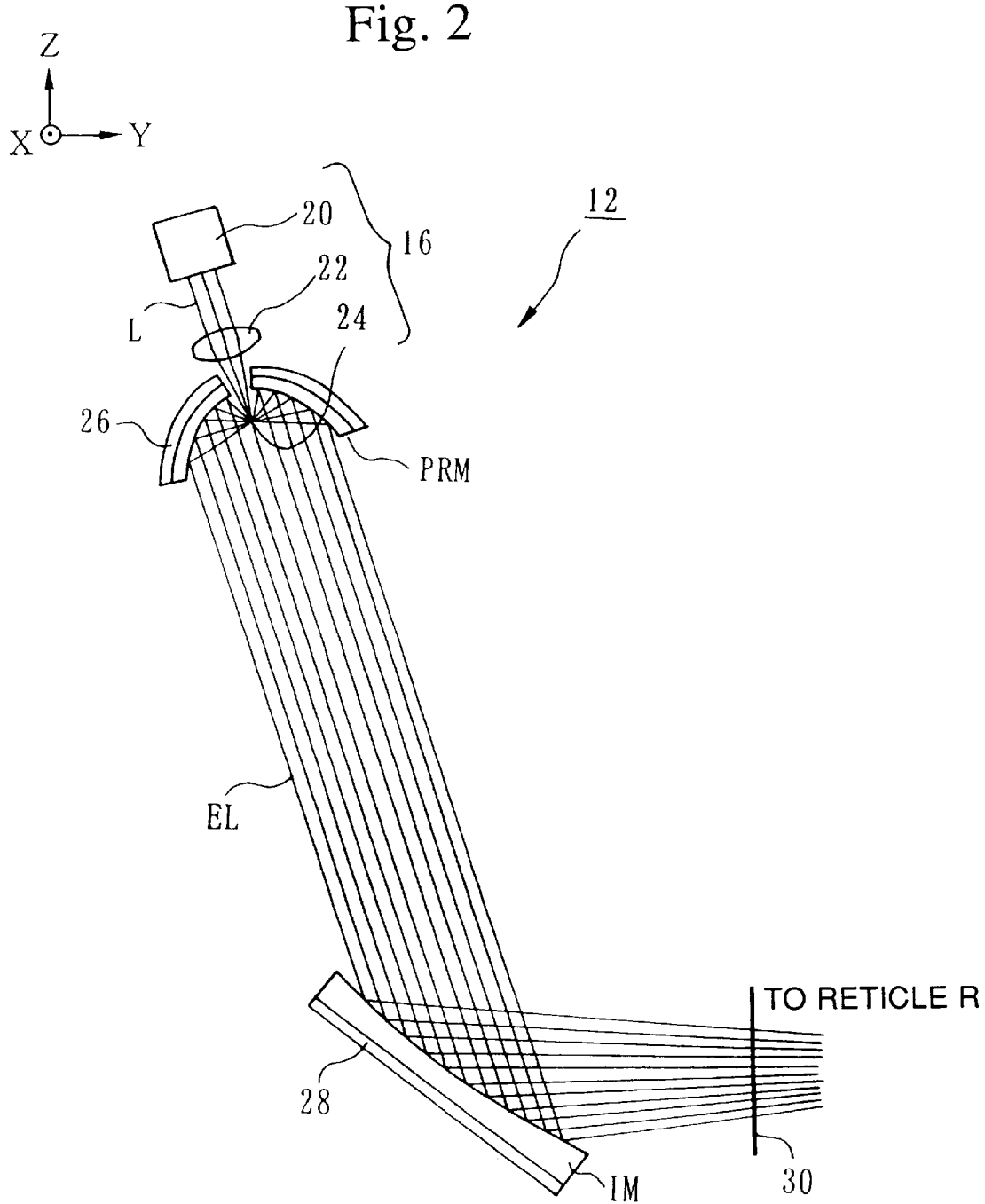
FIG. 2 is a diagram showing the construction of the interior of a light source apparatus of FIG. 1.

The light source apparatus 12, as shown in FIG. 2, comprises a laser plasma light source 16 and a part (PRM, IM, 30) of an illumination optical system. The laser plasma light source 16 comprises for example a high output laser 20 such as a YAG laser or an excimer laser or the like which is excited by a semiconductor laser, a condenser lens 22 for condensing laser light L from the high output laser 20 onto a predetermined focal point, and an EUV radiation generating material 24 such as copper tape arranged at this focal point.

With such a light source apparatus 12, when the laser light L from the high output laser 20 is irradiated onto the EUV radiation emitting material 24 arranged at the focal point of the condenser lens 22, the EUV radiation generating material 24 is heated to a high temperature by the energy of the laser light, and excited to a plasma condition, and when this shifts to a low potential condition, EUV radiation EL is discharged.

Since the EUV radiation EL generated in this manner radiates in all directions, then in order to focus this, a parabolic mirror PRM is provided inside the light source apparatus 12. By means of this parabolic mirror PRM, the EUV radiation EL is focused and converted to a parallel beam. On the inner surface of the parabolic mirror PRM is formed an EUV radiation reflecting layer for reflecting the EUV radiation, and on the rear surface is attached a cooling device 26. For the cooling device 26, from the point of cooling efficiency, one which uses a cooling liquid is preferable, however the device is not limited to such. For the material of the parabolic mirror PRM, from the point of thermal conduction, a metal is suitable. For the EUV radiation reflecting layer formed on the surface of the parabolic mirror PRM, by using a multilayer film with two types of material alternately laminated, then radiation of a specific wavelength only is reflected. For example, a coating of several layers of molybdenum Mo and silicon Si selectively reflects EUV radiation of approximately 13.4 nm wavelength, while a multilayer film of molybdenum and beryllium alternately coated in several layers selectively reflects EUV radiation of around 11.5 nm wavelength. Since the radiation of wavelengths which are not reflected is absorbed by the multilayer film etc. and converted to heat, the temperature of the parabolic mirror PRM rises. In order to cool the parabolic mirror PRM, the beforementioned cooling device 26 is necessary. The EUV radiation EL which is converted to a parallel beam by the parabolic mirror PRM, is a parallel beam having a uniform intensity distribution and a circular cross-section shape perpendicular to the optical axis.

Inside the light source apparatus 12, there is further provided an illumination mirror IM for reflecting the EUV radiation EL which has been changed to a parallel beam, and deflecting this in the direction of the turn up mirror M of FIG. 1, and a wavelength selecting window 30 arranged on the downward side in the progress direction (in FIG. 2, the right side of the page) of the EUV radiation EL of the illumination mirror IM. The illumination mirror IM has a curved surface on the side irradiated by the EUV radiation EL, and a reflecting layer is formed on the surface of the curved face. The reflecting layer consists of a multilayer film formed with two types of material alternately laminated (for example, a coating of several layers of molybdenum Mo and silicon Si). They are designed so that the EUV radiation reflected by the reflecting layer becomes a narrow slit shape on the reticle R.

In FIG. 1, a only part of the illumination optical system, that is to say only the turn up mirror M is shown. However, at least one reflection optical element constituting the illumination optical system is arranged between the light source apparatus 12 (wavelength selection widow 30) and the turn up mirror M. This reflection optical element may be for example an illumination homogenizing member (a reflection type optical integrator) for homogenizing the illumination distribution within a circular-arc shape illumination area IA on the reticle R which is irradiated with the EUV radiation EL. On the surface of this illumination homogenizing member is formed a reflecting film comprising the aforementioned multilayer, and a cooling device similar to the aforementioned cooling device 26 is provided on a rear face side.

The vertical direction on the page in FIG. 2 corresponds to a direction orthogonal to a lengthwise direction of the illumination area of an arc shape (an illumination area of a shape which takes one part of a ring shape illumination area) on the pattern surface of the reticle R. The illumination area has a predetermined area described later. The focal plane is exactly positioned on the pattern surface of the reticle R. In this case, since the emission area of the EUV radiation EL has a finite size, then even though the pattern surface of the reticle R becomes the focal plane, the EUV radiation EL has a width of from 1 mm to 10 mm approximately on that focal plane. Consequently, in illuminating the circular-arc shape illumination area this does not become too narrow. On the rear face side of the reflection surface of the illumination mirror IM there is provided a cooling device 28 similar to the aforementioned cooling device 26. The aforementioned wavelength selection widow 30 is provided for the purpose of cutting off visible light. An EUV reflecting film comprising a multilayer film has relatively sharp wavelength selection characteristics with respect to wavelengths in the vicinity of the EUV radiation, and selectively reflects only specific wavelengths used in the exposure. However, the EUV reflecting film also reflects visible light and ultraviolet radiation. If such lights is irradiated on the reticle R or the projection optical system PO, then due to the surplus energy, the reticle R or the mirror constituting the projection optical system PO (a discussion is given later concerning this) are heated. Hence, in the worst case, unwanted radiation is transferred onto the wafer W, with the likelihood of deterioration of the image. Therefore, the occurrence of such a situation is to be prevented.

Figure 3:
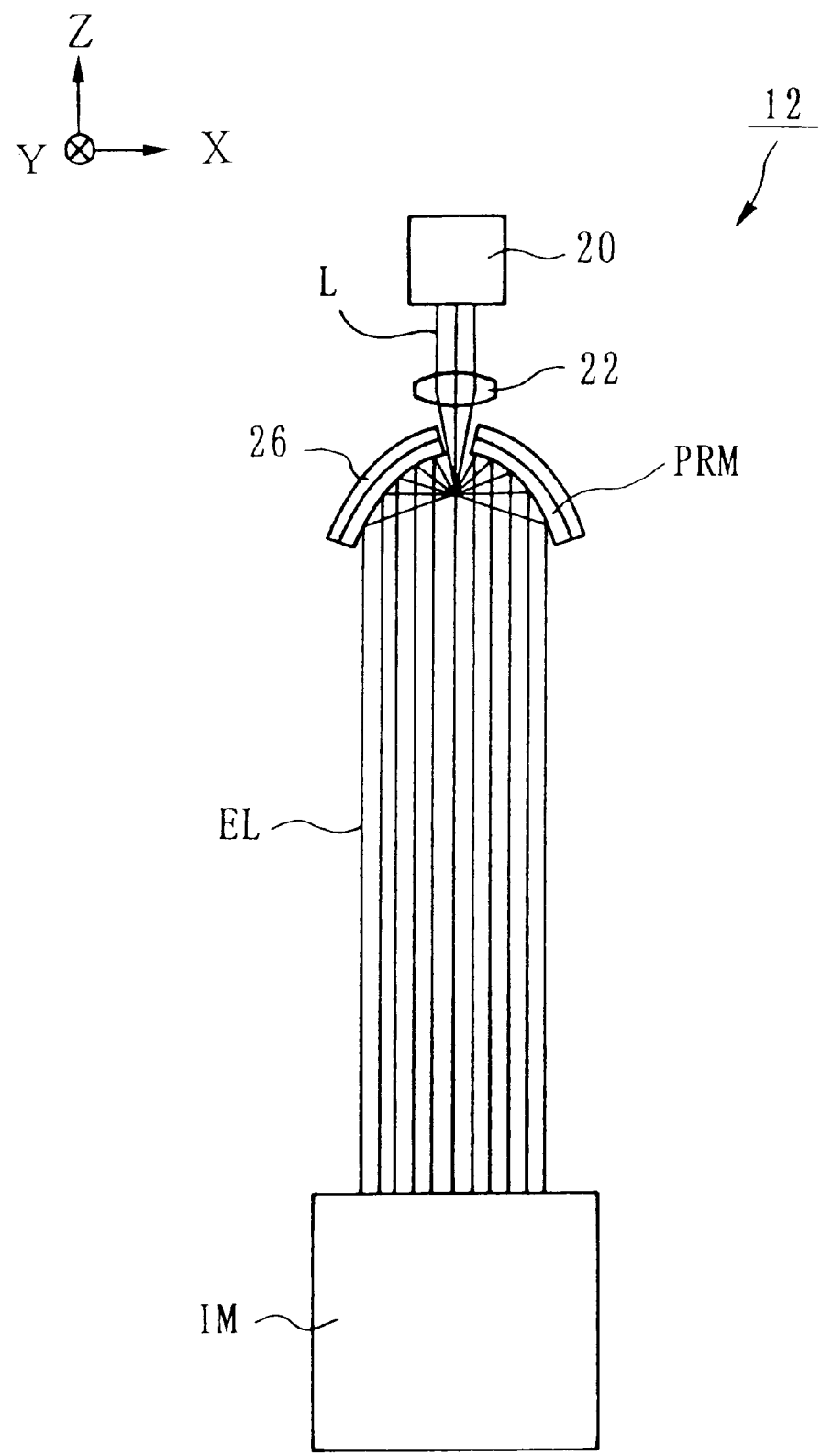
FIG. 3 is a left side view of the light source apparatus of FIG. 2.

FIG. 3 shows the condition of the light source apparatus 12 shown in FIG. 2, as seen from one side in the Y-direction (the left side in FIG. 2). In FIG. 3, the turn up mirror M shown in FIG. 1 is behind the page. The reflection surface of the illumination mirror IM does not appear in FIG. 3. However this is a rectangular shape in the case when seen from behind the page of FIG. 3. That is to say, in FIG. 2 this is a concave surface while in FIG. 3 which is the view on the left side surface, this is a rectangular shape. Therefore the reflection surface of the illumination mirror IM is a shape similar to a part of an inner circumferential surface of a cylinder. In this case, the EUV radiation EL converges in the surface of the page of FIG. 2. However in the page surface of FIG. 3 this is as a parallel beam. Therefore the length in the left and right direction in FIG. 3 becomes the length in the longitudinal direction of the circular-arc shape illumination area described later. Here while this is said to be parallel, since as mentioned before the size of the light source is finite, then the spatial coherency cannot be zero.

Figure 4:
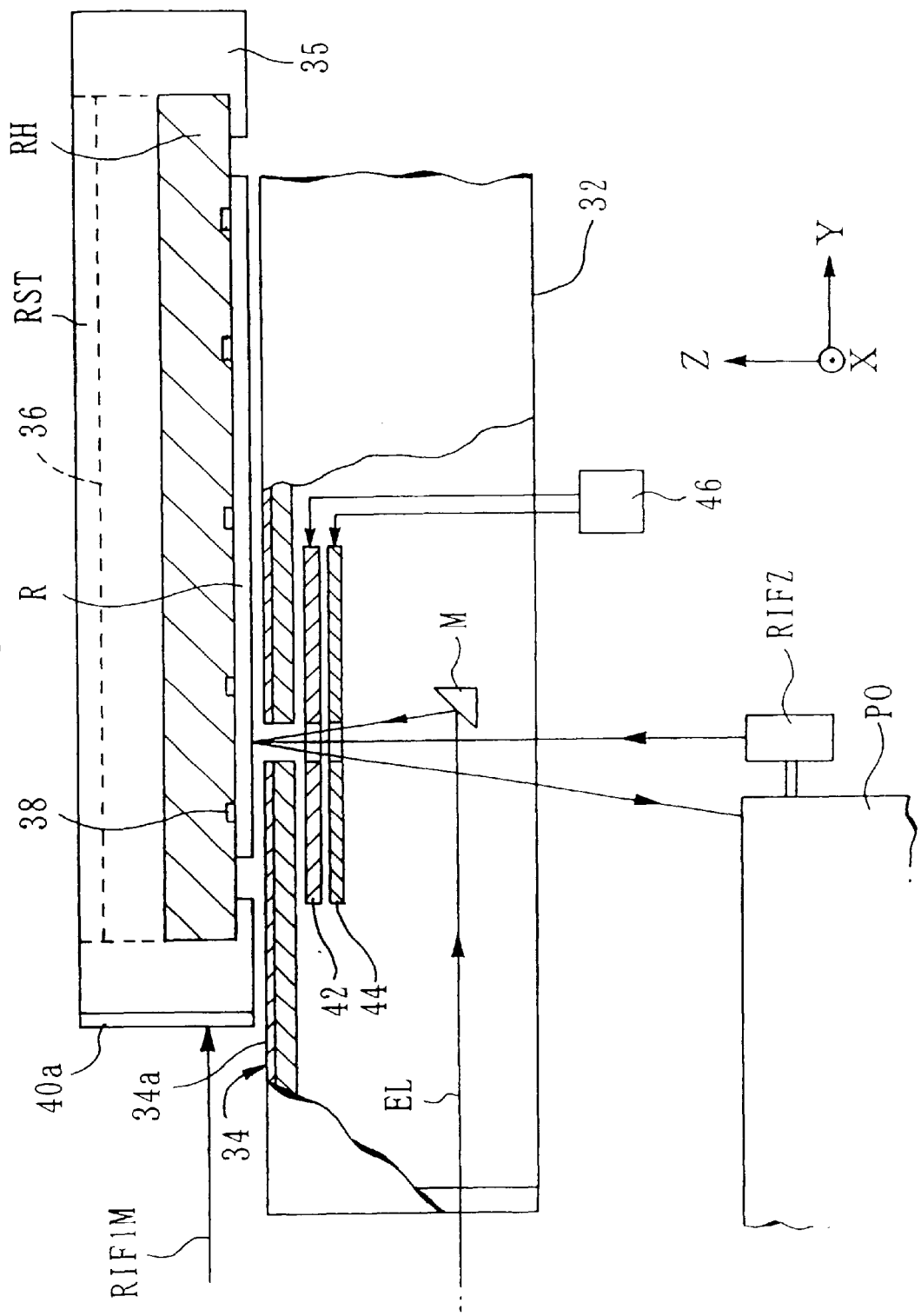
FIG. 4 is a diagram showing in detail the structural parts near the reticle stage of FIG. 1.

Returning to FIG. 1, with the aforementioned reticle stage RST, the view is omitted from FIG. 1. However as shown in FIG. 4, this is arranged on a reticle stage base 32 which is arranged along the X-Y plane, and is floatingly supported on the reticle stage base 32 by a magnetic levitation type two dimensional linear actuator 34. The reticle stage RST is driven by the magnetic levitation type two dimensional linear actuator 34 at a predetermined stroke in the Y-direction, and is also minutely driven in the X-direction and θ-direction (the rotation direction around the Z-axis). Furthermore, the reticle stage RST is constructed so that this can also be minutely driven in an incline direction with respect to the Z-direction and the X-Y plane, by the magnetic levitation type two dimensional linear actuator 34.

A permanent magnet (omitted from the figure) is provided on the bottom of the periphery of the reticle stage RST. The magnetic levitation type two dimensional linear actuator 34 is constructed from this permanent magnet and a coil 34a which is spread in the X-Y two dimensional direction on top of the reticle stage base 32. By controlling the current flowing in the coil 34a by a control unit (not shown in the figure), positioning and attitude control in six dimensional directions of the reticle stage RST is performed.

The reticle stage RST, as shown enlarged in FIG. 4, comprises a reticle holder RH for holding the reticle R so as to face the reticle stage base 32, a stage body 35 for holding a peripheral part of the reticle holder RH, and a temperature control section 36 provided on the rear face side (upper face side) of the reticle holder RH at an inner portion of the stage body 35 for controlling the temperature of the reticle holder RH. In this case, an electrostatic chuck type reticle holder is used as the reticle holder RH. This is because the exposure apparatus 10 of the present embodiment is housed inside a vacuum chamber (not shown) for using EUV radiation EL as the exposure light, and hence a vacuum chuck type reticle holder cannot be used. The material of the reticle holder RH may be such as used with a conventional DUV (deep ultraviolet) or a VUV (vacuum ultraviolet) (XUV) exposure apparatus, such as a heat resistant glass or a ceramic.

A plurality of temperature sensors 38 are arranged at predetermined spacing on the reticle attraction surface of the reticle holder RH. By means of these temperature sensors 38, the temperature of the reticle R can be accurately measured, and temperature control then performed with the temperature control section 36 based on the measured temperature, to keep the temperature of the reticle R at a predetermined target temperature. As a cooling device constituting the temperature control section 36, a liquid cooling type device which draws in cooling liquid via a flexible tube from the outside, a device which uses an electron element such as a Peltier element, or a device which uses a heat exchanger such as a heat pipe may be adopted.

A reflective film for reflecting EUV radiation, is formed on the surface (pattern surface) of the reticle R. This reflective film is for example a multilayer film where two types of material are alternately laminated. In this case, a multilayer film of molybdenum Mo and silicon Si is used, and is a reflective film with a reflectivity of around 70% with respect to EUV radiation of 13.4 nm wavelength. On such a reflective film, a material which absorbs EUV radiation is applied and patterned. If a multilayer reflection film itself is patterned, restoration at the time of a failure is not possible. On the other hand, in the case where an absorber layer is provided on the multilayer reflection and is patterned, pattern restoration becomes possible. Since most of the existing material does not reflect EUV radiation, any material can be used for the absorber layer. With the present embodiment, as mentioned later, in order to measure the Z-direction position of the reticle R, a laser interferometer (RIFZ1 to RIFZ3) is used. Therefore, the absorber layer is made from a material which can achieve a reflectivity commensurable with the reflective layer, with respect to the measurement beam (visible region light) from the laser interferometer. Apart from this, as a basis for selection of this absorber layer forming material there can be given factors such as; ease of patterning, adhesiveness with the reflection layer, minimal change with time due to oxidation and the like.

Figure 5:
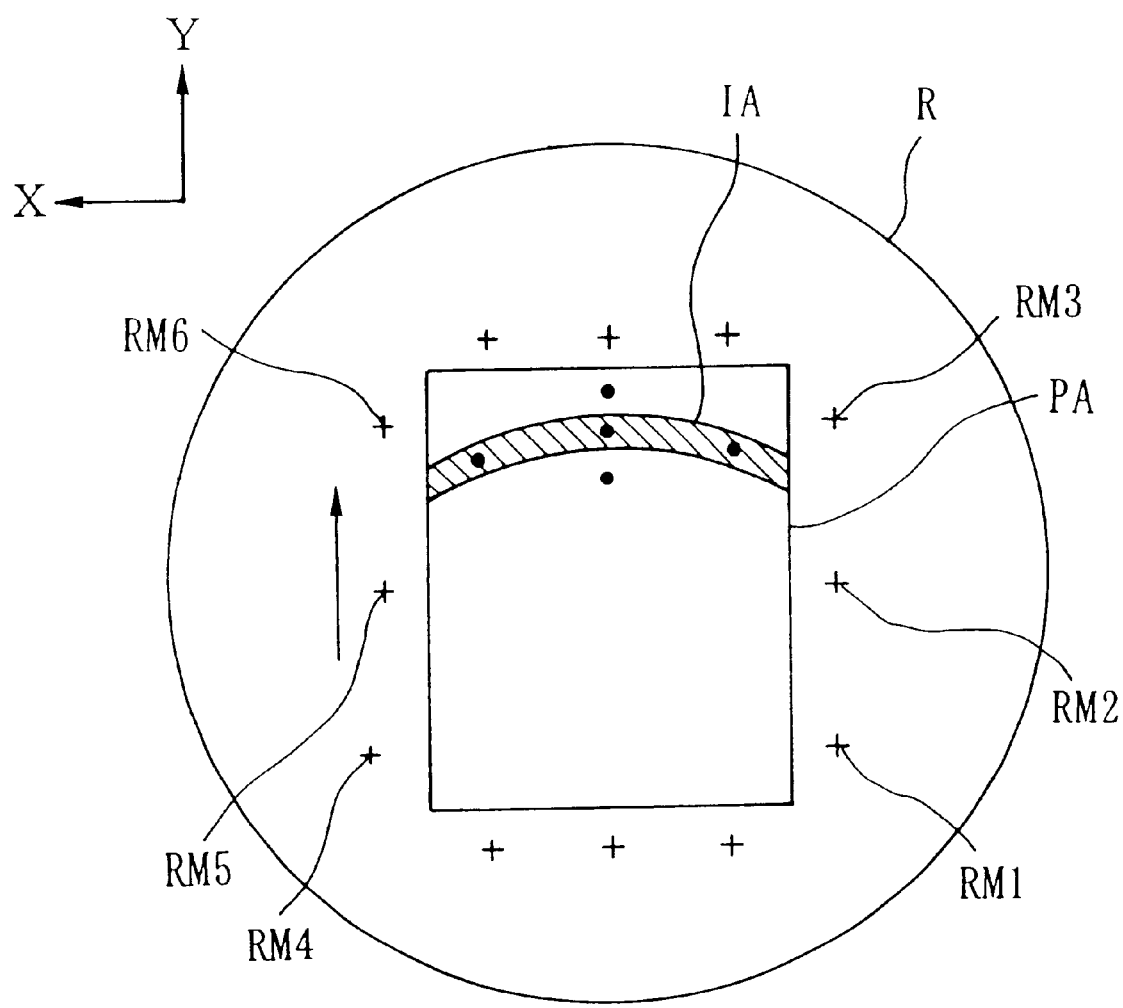
FIG. 5 is a schematic plan view of a reticle.

FIG. 5 shows one example of the reticle R. The rectangular shape area at the center in the figure is a pattern area PA. The arc shape area with oblique lines is the arc shaped illumination area IA which is irradiated with the EUV radiation EL, being the exposure light. The reason for carrying out illumination using the circular-arc shape illumination area, is so that only an area where the various aberrations of a later described projection optical system PO are a minimum can be used. Moreover, reticle alignment marks RM1 to RM6 serving as alignment marks, are formed at predetermined spacing along the Y-direction on opposite sides in the X-direction of the pattern area PA of the reticle R. The reticle alignment marks RM1 and RM4, RM2 and RM5 and RM3 and RM6 are respectively arranged approximately along the X-direction.

As is clear from FIG. 5, since in the case where the circular-arc shape illumination area IA is used, it is not practical to perform batch exposure (static exposure), then in the present embodiment, scanning exposure as described later is performed.

Since the reflective layer is formed on the surface of the reticle R as mentioned above, the material for the reticle R itself is not particularly important. As a material for the reticle R, for example low heat expansion (heat resistance) glass, quartz glass (including for example ZERODUR (trade name) of the Shot company, ULE (trade name) of the Corning company, or fluorine doped synthetic quartz), ceramics, silicon wafers and the like are considered. As a basis for this material selection, there is given for example use of a material for the reticle R which is the same as the material of the reticle holder RH. In this case, thermal expansion occurs in the reticle R and the reticle holder, attributable to a temperature rise due to irradiation etc. of the EUV radiation EL used for illumination. However if both the materials are the same, these expand by the same amount. Hence there is merit in that a force tending to cause displacement between the two members (thermal stress) does not act. Not only with this, if materials which may be different but have the same coefficient of linear expansion are used as the materials for the reticle R and the reticle holder RH, the same affect can be obtained. For example, it can be considered to use a silicon wafer for the reticle R and SiC (silicon carbide) for the reticle holder RH. If a silicon wafer is used as the material for the reticle R, this has the advantage that a processing apparatus such as a pattern drawing apparatus, a resist applying apparatus, an etching apparatus and the like, can be used as such, in the manufacturing process for the reticle R. In the present embodiment, for these reasons, a silicon wafer is used as the material for the reticle R, and the reticle holder RH is formed from SiC.

As shown in FIG. 4, a movable blind 42 and a slit plate 44 serving as a field stop, are arranged beneath the reticle R (on the EUV radiation incident side) inside the reticle stage base 32 and close to the reticle R.

Returning to FIG. 1, the projection optical system PO is made from only several, for example around 3 to 6, reflection optical elements (mirrors). Only the image surface side uses a telecentric reflection optical system. Here a device with a projection magnification of ¼ times is used. Consequently, the EUV radiation EL which is reflected by the reticle R and contains the pattern information drawn on the reticle R, is reduced by one quarter by the projection optical system PO, and irradiated onto the wafer W.

Here the projection optical system PO will be described is a more detail using FIG. 6. The projection optical system PO comprises a total of four mirrors (reflection optical elements) namely: a first mirror M1, a second mirror M2, a third mirror M3, and fourth mirror M4, for successively reflecting EUV radiation EL reflected by the reticle R, and a lens-barrel PP for holding these mirrors M1 to M4. The reflection surfaces of the first mirror M1 and the fourth mirror M4 have an aspherical surface shape, the reflection surface of the second mirror M2 is a plane surface, while the reflection surface of the third mirror M3 is spherical shape. With respect the respective reflection surfaces, a machining accuracy of around ⅕₀th to less than ⅙₀th of the exposure wavelength is achieved for the design value. At the RMS value (standard deviation) these have an error of only from 0.2 nm to 0.3 nm or less. The material of the respective mirrors is a heat resistance glass or a metal. A reflective layer with respect to EUV radiation is formed on the surface as with the reticle R, by alternately laminating two types of material to give a multilayer film.

In this case, so that the light reflected by the first mirror M1 can reach the second mirror M2, an opening is made in the fourth mirror M4. Similarly, so that the light reflected by the fourth mirror M4 can reach the wafer W, an opening is formed in the first mirror M1. Of course, rather than making an opening, the external shape of the mirror may be formed with a cut-out through which the beam of light can pass.

Since the environment in which the projection optical system PO is placed is also a vacuum, there is no way for the heat due to irradiation of the exposure illumination light, to escape. Therefore, with the present embodiment, heat pipes HP are connected between the mirrors M1 to M4 and the lens-barrel PP which holds the mirrors M1 to M4, and a cooling device is provided for cooling the lens-barrel PP. That is to say, the lens-barrel PP has a double construction with an inside mirror holding portion 50, and a cooling jacket 52 serving as a cooling device, mounted on an outer peripheral portion thereof. A coiled pipe 58 is provided on the inside of the cooling jacket 52 for passing a cooling liquid from an inlet tube 54 side to an outlet tube 56 side. Here for the cooling liquid, chilled water is used. The chilled water which is discharged from the cooling jacket 52 via the outlet tube 56, is subjected to heat exchange with a refrigerant inside a refrigeration unit (not shown). Then after being cooled to a predetermined temperature, the chilled water flows into the cooling jacket 52 via the inlet tube 54. In this way, the chilled water is circulated.

Therefore, with the projection optical system PO of the present embodiment, even though heat energy is applied to the mirrors M1, M2, M3 and M4 due to irradiation of the exposure illumination light (EUV radiation) EL, heat exchange is carried out with the lens-barrel PP which is temperature controlled to a constant temperature by the heat pipes HP. Hence the mirrors M1, M2, M3 and M4 are cooled to this constant temperature. In this case, since with the mirrors M1, M2 and M4 and the like, the heat pipes HP are affixed not only to the rear surface side but also to the portion on the front surface side (reflection surface side) where the exposure illumination light is not irradiated, then compared to the case where only the rear surface side is cooled, cooling of the respective mirrors can be more effectively performed. Here needless to say, the heat pipes HP on the rear surface side of the third mirror M3 and on the front surface side of the first mirror M1 reach to the inner peripheral face of the lens-barrel PP, in the direction to behind the page. The external appearance of the lens-barrel PP is a square column shape.

Returning to FIG. 1, the aforementioned wafer stage WST is arranged on a wafer stage base 60 which is arranged along the X-Y plane, and is floatingly supported on the wafer stage base 60 by a magnetic levitation type two dimensional linear actuator 62. The wafer stage WST is driven by the magnetic levitation type two dimensional linear actuator 62 at a predetermined stroke in the X-direction and Y-direction, and is also minutely driven in the θ-direction (the rotation direction around the Z-axis). Furthermore, the wafer stage WST is constructed so that this can also be minutely driven in the Z-direction and in an incline direction with respect to the X-Y plane (that is, in a rotational direction around the X-axis and Y-axis), by the magnetic levitation type two dimensional linear actuator 62.

A permanent magnet (omitted from the figure) is provided on the bottom face of the wafer stage WST. The magnetic levitation type two dimensional linear actuator 62 is constructed from this permanent magnet and a coil (omitted from the figure) which is spread in the X-Y two dimensional direction on top of the wafer stage base 60. By controlling the current flowing in the coil by a later described control unit MCS (refer to FIG. 1), positioning and attitude control in six dimensional directions of the wafer stage WST is performed.

Figure 7:
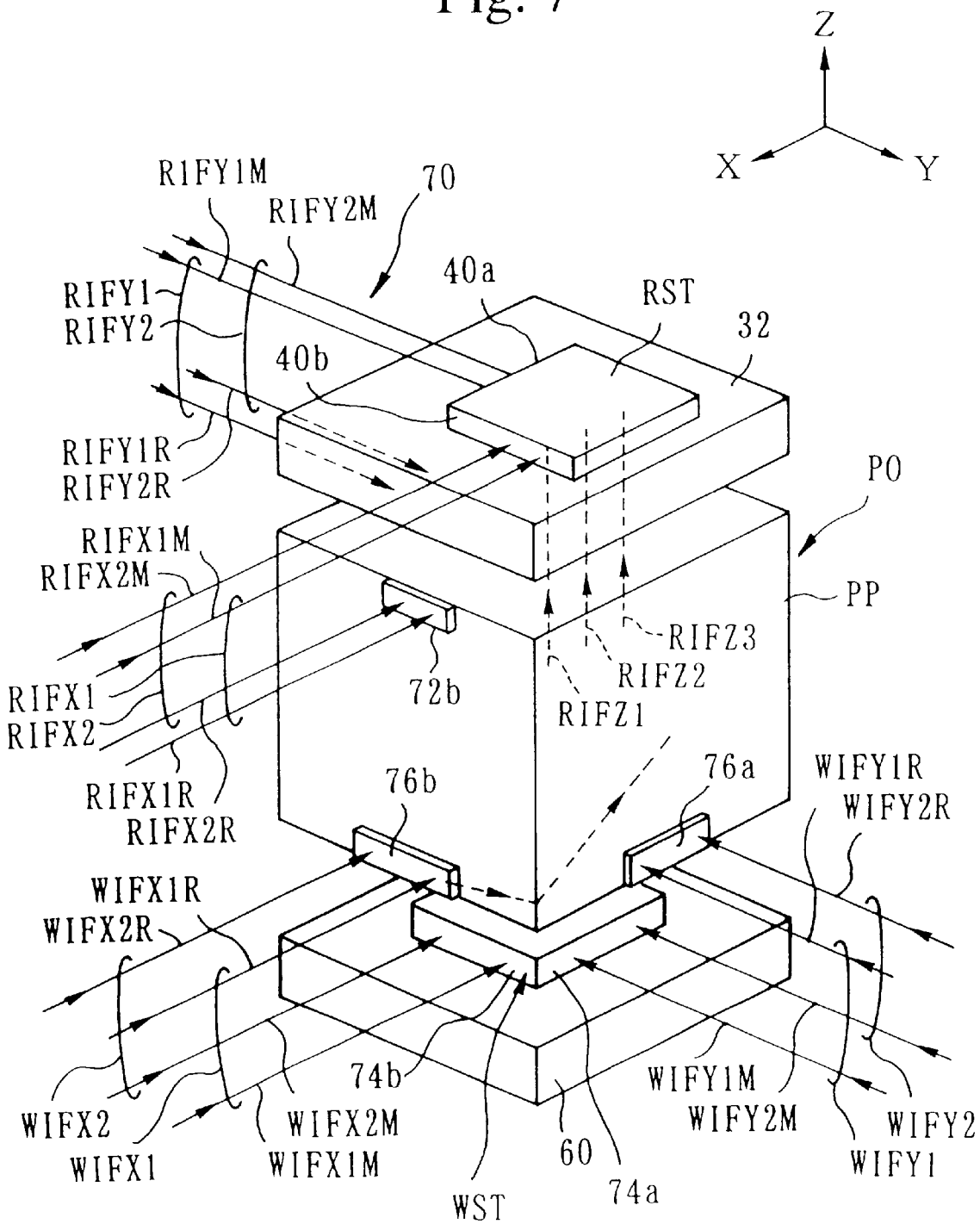
FIG. 7 is a diagram for explaining the construction of an interferometer system for measuring the position in the XY plane of a reticle stage and a wafer stage.

On the upper surface of the wafer stage WST is mounted an electrostatic chuck type wafer holder (not shown). By means of this wafer holder, the wafer W is attracted and held. Moreover, the side face of the wafer stage WST on the other side in the Y-direction in FIG. 1 is made a mirror finish, and forms a mirror surface 74a with respect to light in the visible region. Furthermore, while illustration is omitted from FIG. 1, as shown in FIG. 7, a mirror finish is also formed on the side face of one side in the X-direction of the wafer stage WST, forming a reflective surface 74b with respect to light in the visible region.

As shown in FIG. 1, an space image measuring instrument FM is provided on an edge portion of the upper surface of the wafer stage WST, in order to measure the relative position between the position where the pattern drawn on the reticle R is projected onto the surface of the wafer W and the position of the alignment optical system ALG (so called base line measurement). This space image measuring instrument FM corresponds to the reference mark plate of conventional DUV or VUV exposure apparatus.

Figure 8A:
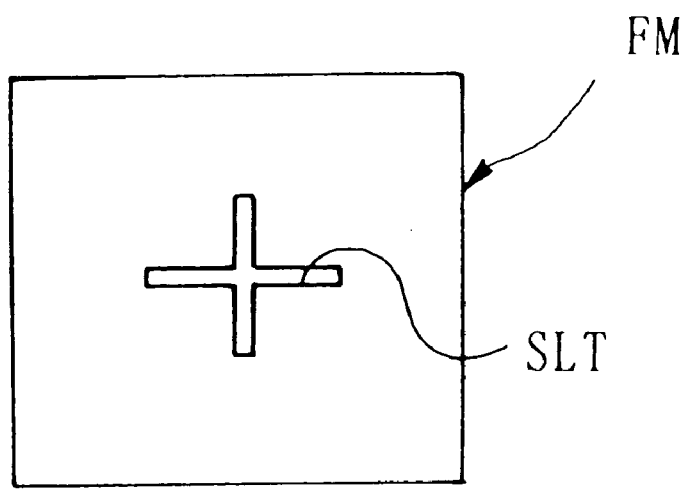
Figure 8B:
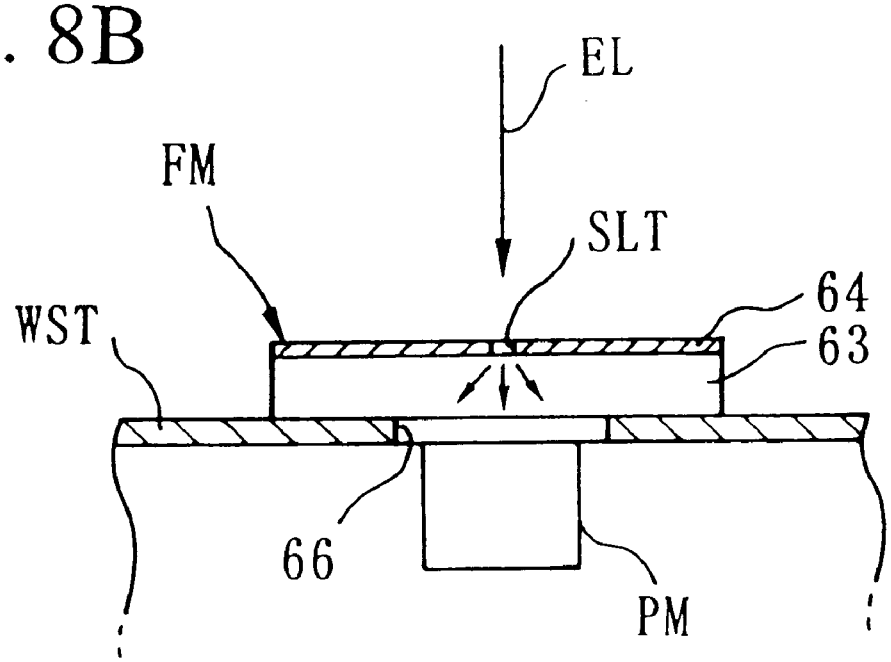
FIG. 8B is a side view showing the aerial measuring instrument.

FIG. 8A and FIG. 8B respectively show the plan view and the transverse view of the space image measuring instrument FM. As shown in these figures, a slit SLT serving as an aperture, is formed on the upper surface of the space image measuring instrument FM. This slit SLT is patterned on an EUV radiation reflective layer 64 formed on the surface of a fluorogenic substance 63 of a predetermined thickness fixed onto the surface of the wafer stage WST. Instead of the reflective layer 64, an EUV radiation absorbing layer may be provided, and an aperture may be formed in this absorbing layer.

An opening 66 is formed on the upper surface plate of the wafer stage WST beneath the slit SLT. A photoelectric transducer PM such as a photomultiplier is arranged on the inner portion of the wafer stage WST facing this opening 66. Consequently, when EUV radiation EL is irradiated onto the space image measuring instrument FM from above via the projection optical system PO, the EUV radiation which has passed through the slit SLT reaches the fluorogenic substance 63, and the fluorogenic substance 63 generates light of a long wavelength compared to the EUV radiation. This light is received by the photoelectric transducer PM and converted to an electrical signal corresponding to the strength of the light. The output signal from the photoelectric transducer PM is also supplied to a control device (MCS).

According to the exposure apparatus 10, by means of an interferometer system 70 shown in FIG. 7, the position and rotation amount of the reticle stage RST and the wafer stage WST are each accurately measured with the projection optical system PO as a reference.

The interferometer system 70 comprises four laser interferometers RIFX1, RIFX2, RIFY1 and RIFY2 for measuring the position of the reticle stage RST in the XY plane, and four laser interferometers WIFX1, WIFX2, WIFY1 and WIFY2 for measuring the position of the wafer stage WST in the XY plane.

The interferometers RIFX1, RIFX2, RIFY1, RIFY2, WIFX1, WIFX2, WIFY1 and WIFY2 project a measuring beam (in the figure an "M" is attached to the end of the symbol for the interferometer. For example the measuring beam for the interferometer RIFX1 has the symbol "RIFX1M") onto the reflecting surfaces 40a and 40b of the reticle stage RST or the reflecting surfaces 74a and 74b of the wafer stage WST, and project a reference beam (as with the measuring beam, with an "R" attached to the end of the symbol for the interferometer. For example the reference beam for the interferometer RIFX1 has the symbol "RIFX1R") onto the fixed mirrors (reference mirrors) 72a (refer to FIG. 1), 72b, 76a, and 76b attached to the lens-barrel PP of the projection optical system PO, and receive the light of the respective reflected beams. In this way, at the projection positions of the measuring beam, the relative positions in the Y-direction and X-direction of the reticle stage RST or the wafer stage WST with respect to the fixed mirrors 72a, 72b, 76a and 76b, are measured. Based on the measurement values of the interferometers RIFX1, RIFX2, RIFY1, RIFY2, WIFX1, WIFX2, WIFY1 and WIFY2, the position and rotation angle of the reticle stage RST or the wafer stage WST are measured. Then based on the measurement results of the interferometer system 70, the attitude control for the reticle stage RST and the wafer stage WST is automatically performed.

Returning to FIG. 1, a reticle surface measuring laser interferometer RIFZ serving as a measuring device for measuring the position of the reticle R in the Z-direction (first axis direction), is provided on the lens-barrel PP of the projection optical system PO which becomes the reference for all of the measurements of the eight interferometers. For the laser interferometer RIFZ, actually as shown in FIG. 7, three laser interferometers, namely RIFZ1, RIFZ2 and RIFZ3, are arranged at predetermined spacing, and secured to the lens-barrel PP. However, in FIG. 1 (and FIG. 4) these are representatively shown as the laser interferometer RIFZ.

As shown in FIG. 1, the measurement beams from the laser interferometers RIFZ1 to RIFZ3 are projected onto the pattern surface of the reticle R along a path parallel with the Z-direction, so that these become the center of the incident optical path and the outgoing optical path (reflection optical path) of the exposure light EUV radiation EL at the irradiation region of the exposure EUV radiation EL projected onto the pattern surface of the reticle R at a predetermined incident angle θ by the turn up mirror M, that is to say at the three different points in the circular-arc illumination area IA (refer to FIG. 1 and FIG. 4). Therefore, the interferometers RIFZ1, RIFZ2 and RIFZ3 can measure the Z-direction of the reticle R at a high accuracy (for example an accuracy of from several nm to 1 nm or less) without exerting an influence on the exposure EUV radiation EL which is slantingly incident at a predetermined incident angle θ onto the pattern image of the reticle R, and reflected with an outgoing angle the same as the incident angle thereof. Moreover, the interferometer measuring beams do not receive an influence from the exposure EUV radiation EL. Hence the position of the reticle R in the Z-direction can be measured at a high accuracy (for example an accuracy of from several nm to 1 nm or less).

Then, based on predetermined adjustment position information measured by at least one of the reticle surface measuring laser interferometers RIFZ1, RIFZ2 and RIFZ3, in order to maintain the spacing always constant between the exposure light center (the transfer center for the reticle pattern) of the projection optical system PO and the pattern surface of the reticle R, the magnetic levitation type two dimensional linear actuator 34 shown in FIG. 4 is controlled to synchronously move the reticle stage RST and the wafer stage WST along the Y-axis direction (second axis direction) while adjusting the position of the reticle R in the optical axis direction (the first axis direction, Z-direction) of the projection optical system PO.

On the other hand, as shown in FIG. 1, the Z-direction of the wafer W referenced to the lens-barrel PP, is measured by an oblique incidence type focus sensor 14 which is secured to the projection optical system PO. This focus sensor comprises; a transmitting optical system 14a secured to a column (not shown in the figure) for supporting the lens-barrel PP, for irradiating a detection beam FB from an incline direction with respect to the wafer W surface, and a reception optical system 14b secured to the same column (not shown in the figure) for receiving the detection beam FB reflected by the wafer W surface. For this focus sensor, there is used for example a multipoint focal point position detection system as disclosed for example in Japanese Unexamined Patent Application, First Publication No. 6-283403, and U.S. Pat. No. 5,448,332 corresponding to this. The disclosures of the above Japanese Publication and the US patent are incorporated as a part of the present specification. It is important that this focus sensor 14 (14a, 14b) is secured integrally with the lens-barrel PP.

By means of these focus sensors 14a, 14b, the spacing between the wafer W surface and the projection optical system PO, and the inclination of the wafer W surface with respect to the X-Y plane are measured. Then based on these, the wafer stage WST is controlled by way of the magnetic levitation type two dimensional linear actuator 62 so that the spacing and parallelism between the wafer W surface and the projection optical system PO is always constant.

Furthermore, in the present embodiment, the alignment optical system ALG is secured to the side face of the projection optical system PO. For this alignment optical system ALG, various types may be used such as an imaging type alignment sensor which irradiates broad band radiation onto an alignment mark (or an space image measuring instrument FM) on top of the wafer W and receives the reflected radiation and performs mark detection by an image processing method, an LIA (laser interferometric alignment) type alignment sensor which irradiates laser radiation onto a lattice mark and detects diffracted radiation, or an AFM (interatomic force microscope) scanning type probe microscope.

Figure 6:
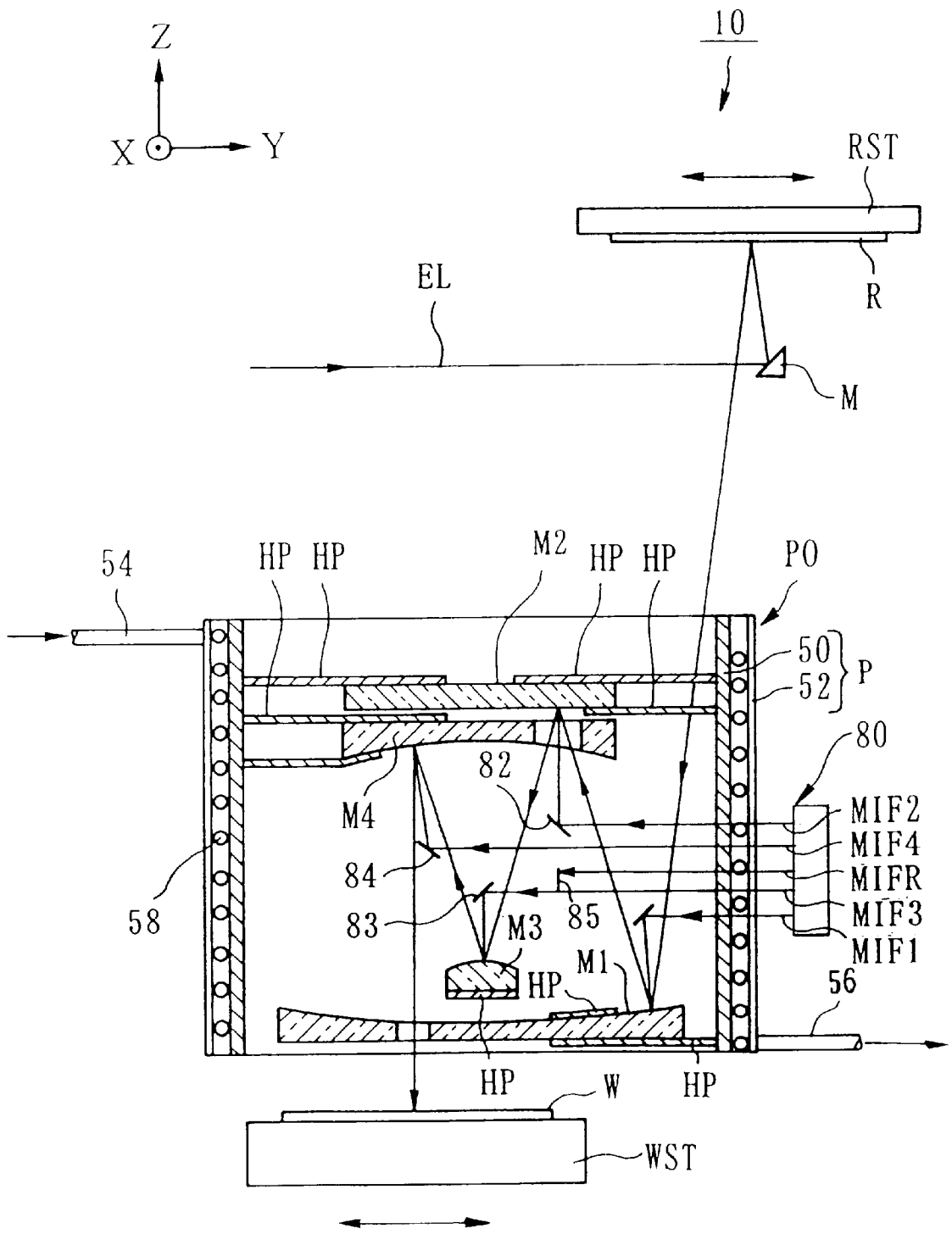
FIG. 6 is a diagram showing schematically the internal structure of the projection optical system of FIG. 1.

Furthermore, as shown in FIG. 6, a mirror monitor system (detector) 80 is provided in the exposure apparatus 10 for monitoring the positions of the four mirrors, namely the first mirror M1, the second mirror M2, the third mirror M3, and the fourth mirror M4, constituting the projection optical system PO.

The mirror monitor system 80 comprises a laser interferometer (not shown in the figure). This laser interferometer projects measuring beams MIF1, MIF2, MIF3 and MIF4 thereof respectively onto the first mirror M1, the second mirror M2, the third mirror M3, and the fourth mirror M4 via the turn up mirrors 81, 82, 83 and 84, and projects a reference beam MIFR onto a reference mirror 85 provided at a predetermined location. Then by receiving the respective reflected beams, the relative positions of the first mirror M1, the second mirror M2, the third mirror M3, and the fourth mirror M4 with respect to the reference mirror 85 at the projection position of the measuring beams MIF1, MIF2, MIF3 and MIF4, is measured.

At this time, the measuring beams MIF1, MIF2, MIF3 and MIF4 are projected so as to be orthogonal to the reflection surfaces at the irradiation positions for the EUV radiation EL for each of the first mirror M1, the second mirror M2, the third mirror M3, and the fourth mirror M4. As a result, the measuring beams MIF1, MIF2, MIF3 and MIF4 are slantingly incident at a predetermined incident angle, and thus do not exert an influence on the exposure EUV radiation EL which is reflected at an outgoing angle the same as the incident angle thereof. Moreover, the interferometer measuring beams do not receive an influence from the exposure EUV radiation EL. Hence the position information for the first mirror M1, the second mirror M2, the third mirror M3, and the fourth mirror M4 at the irradiation positions of the EUV radiation EL can be measured at a high accuracy (for example an accuracy of from several nm to 1 nm or less).

Here the measurement beams MIF1, MIF2, MIF3 and MIF4 are preferably constructed so that these are irradiated on a plurality of positions within a radiation region of the EUV radiation EL, for each of the first mirror M1, the second mirror M2, the third mirror M3, and the fourth mirror M4. With such a construction, position information such as the inclination or deformation of the first mirror M1, the second mirror M2, the third mirror M3, and the fourth mirror M4 can also be measured. Moreover, with the turn up mirrors 81, 82 and 83 and the reference mirror 85, in order to eliminate any measurement errors due to positional changes between these mirrors, preferably these are fixed to the same base member (not shown in the figure).

For the first mirror M1, the second mirror M2, the third mirror M3, and the fourth mirror M4 which constitute the projection optical system PO, there is provided a correction system (correction apparatus) CS for correcting the position, attitude, shape or the like of the mirrors, based on position information measured by the mirror monitor system 80. This correction system CS is controlled by the control unit MCS. For this correction system CS (FIG. 1), there is for example the construction as with the technology disclosed in Japanese Unexamined Patent Publication, First Publication No. 9-63923 previously published by the present applicants, where an actuator such as a piezo element or the like is arranged on the respective rear face sides or peripheries of the first mirror M1, the second mirror M2, the third mirror M3, and the fourth mirror M4. With this correction system CS (FIG. 1), by applying a desired stress to the first mirror M1, the second mirror M2, the third mirror M3, or the fourth mirror M4 from the rear face side or the periphery using the actuator, the position, attitude, or shape of the mirrors can be changed. Here with the present embodiment, a plurality of actuators for a single mirror are arranged two dimensionally, and by means of these, at least one of the position, attitude (including inclination) and the surface shape of each mirror, can be optionally adjusted.

Next, is a description of the operation of an exposure process by the exposure apparatus 10 according to the present embodiment constructed as described above.

Figure 9:
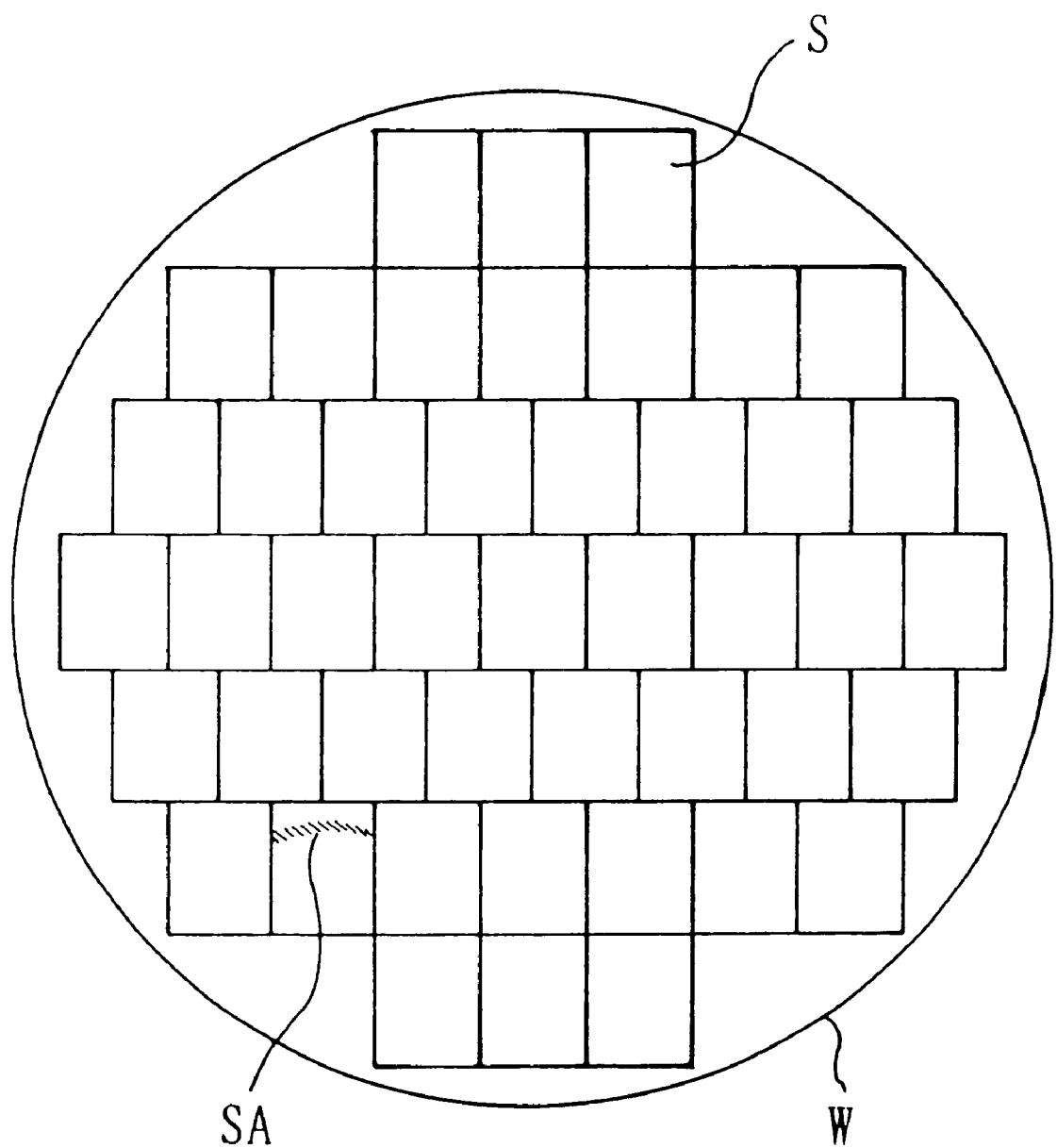
FIG. 9 is a diagram showing the appearance where a reticle pattern is transferred to a plurality of shot regions on a wafer.

In this exposure process, while monitoring the position information from the interferometer system 70, the wafer stage WST is positioned at a scanning start position for a first shot region by means of the magnetic levitation type two dimensional linear actuator 62. Together with this, the reticle stage RST is positioned at the scanning start position by means of the magnetic levitation type two dimensional linear actuator 34. Then the scanning exposure for the first shot region is carried out. At the time of this scanning exposure, the control apparatus (not shown) by means of the magnetic levitation type two dimensional linear actuators 34 and 62, controls the speed of the reticle stage RST and the wafer stage WST so that the speed ratio of these accurately conforms with the projection magnification of the projection optical system PO, and in this constant velocity synchronized condition for the speed ratio for the two stages, exposure (transfer of the reticle pattern) is carried out. On completion of the scanning exposure for the first shot region, an inter-shot stepping operation which moves the wafer stage WST to the scanning start position for the second shot region is carried out. Then scanning exposure for the second shot region is performed in the same manner as above. In this case, so that the return operation for the reticle stage RST can be omitted in order to improve throughput, the direction for the scanning exposure for the first shot region and the second shot region can be reversed. That is to say, in the case where the exposure for the first shot region is performed from one side on the Y-axis towards the other side, the exposure for the second shot region is performed from the other side towards the one side. That is, alternate scanning is performed. The inter-shot stepping operation and the shot scanning exposure operation are repeated in this way, and the pattern on the reticle R is transferred to all of the shot regions on the wafer W by a step-and-scan method. FIG. 9 shows the appearance where in this way, the reticle pattern is transferred to a plurality of shot regions S on the wafer W. In the case of FIG. 9, so as to obtain shot regions of complete shapes with good efficiency from a single wafer, the number of shot regions within one row is made a suitable even number or odd number. Here in the case of correcting magnification error of the transfer image of the reticle pattern and the shot region (the already formed pattern) in relation to the scanning direction, the speed ratio of the reticle stage RST and the wafer stage WST during scanning exposure is made so as not to conform to the projection magnification of the projection optical system PO.

Prior to carrying out the exposure step, aberrations of the transmission wave front are measured beforehand using as an aberration detection device (measuring device), the technique disclosed for example in Japanese Unexamined Patent Application, First Publication No. 57-64139. That is using a point-diffraction interferometer or the like which measures surface shape by interference of an object to be detected with a spherical wave as a reference wave. Then based on this, the respective positions of the first mirror M1, the second mirror M2, the third mirror M3, and the fourth mirror M4 constituting the projection optical system PO are pre-adjusted. Here, with the present embodiment, the wave front aberration of the projection optical system PO is measured. However characteristics other than this (for example coma-aberration, spherical aberration etc.) may be measured.

The condition of the first mirror M1, the second mirror M2, the third mirror M3, and the fourth mirror M4 in this condition is the "standard condition".

After this, the exposure is performed as described above. However at this time, periodically at a suitable interval such as at each exposure of one wafer W, or each predetermined time such as each hour or each day, position information (including change amount from the aforementioned reference condition) of for example position, inclination, or shape of the first mirror M1, the second mirror M2, the third mirror M3, and the fourth mirror M4 constituting the projection optical system PO, is measured by the mirror monitor system 80. Then based on the obtained position information, if a position or inclination deviation occurs or if a deformation of the like occurs with respect to the initial condition, the control unit MCS corrects the first mirror M1, the second mirror M2, the third mirror M3, or the fourth mirror M4 by changing with the correction mechanism (actuator) CS, the movement, attitude, shape or the like by a required dimension only, to thereby maintain the standard condition.

In this way, by aberration measurement of the transmission wave front, long term stability of the projection optical system PO is achieved. Furthermore, by means of the mirror monitor system 80 and the correction system (actuator) CS, periodic (short term) performance assurance is performed.

As described above, with the exposure apparatus 10, the exposure method and the device manufacturing method, the position information such as position, inclination and shape of the first mirror M1, the second mirror M2, the third mirror M3, and the fourth mirror M4 constituting the projection optical system PO is measured by the mirror monitor system 80. Then, based on the obtained information, correction is made by the actuators constituting the correction system CS enabling the standard condition to be maintained. Therefore, for example in the case where due to heat or the like, a change occurs in the first mirror M1, the second mirror M2, the third mirror M3, or the fourth mirror M4 constituting the projection optical system PO, this is corrected, thus enabling the intrinsic exposure performance to be maintained and stable exposure performed.

Furthermore, with the mirror monitor system 80, since a laser interferometer is used in the detection of the position information for the first mirror M1, the second mirror M2, the third mirror M3, and the fourth mirror M4, then the measurement can be made without contacting the first mirror M1, the second mirror M2, the third mirror M3, or the fourth mirror M4. Moreover since the respective measurement beams MIF1, MIF2, MIF3 and MIF4 are irradiated orthogonal with respect to the reflection surfaces of the first mirror M1, the second mirror M2, the third mirror M3, and the fourth mirror M4, then the number of turn up mirrors 81, 82, 83, and 84 can be kept to a minimum. Furthermore, since position information for the same location as the irradiation position of the EUV radiation EL can be measured, then high accuracy measurement can be made. In addition, if the turn up mirrors 81, 82, 83 and 84 and the reference mirror 85 are integrally provided on a single base member or the like (not shown), changes in the relation of the relative positions of the first mirror M1, the second mirror M2, the third mirror M3, and the fourth mirror M4 can be prevented.

Furthermore, for the correction system CS for correcting the position, attitude, shape or the like of the first mirror M1, the second mirror M2, the third mirror M3, and the fourth mirror M4 constituting the projection optical system PO, for example there is provided an actuator such as a piezo element on the respective rear face sides or peripheries of the mirrors. With this, by applying a desired stress to the first mirror M1, the second mirror M2, the third mirror M3, or the fourth mirror M4 with the actuator, the position, attitude or shape of the mirrors can be corrected.

Moreover, in the abovementioned exposure method, for example at the time of installing the exposure apparatus 10, the aberration of the transmission wave front of the projection optical system PO is measured, and the respective positions of the first mirror M1, the second mirror M2, the third mirror M3, and the fourth mirror M4 are pre-adjusted. After this, correction is periodically performed based on position information measured by the mirror monitor system 80. As a result, calibration is performed at the initial condition, and after an assurance of exposure performance has been obtained, this performance can be easily maintained. Moreover, desirably the aforementioned aberration detection device (in particular a received ray system) is provided on the wafer stage WST, and the optical characteristics (aberration etc.) of the projection optical system PO periodically measured with this aberration detection device. In this way, residual errors in the optical characteristics occurring due to adjustment with only the mirror monitor system 80 can be detected. Then based on the detection results, at least one of the mirrors M1 to M4 can be adjusted with the correction system (actuator) CS so that this residual error can be corrected.

Furthermore, with the exposure method, the construction may be such that the measuring beams MIF1, MIF2, MIF3 and MIF4 are irradiated on a plurality of locations within the irradiation region of the EUV radiation EL, for each of the first mirror M1, the second mirror M2, the third mirror M3, and the fourth mirror M4. With such a construction, position information such as the inclination or deformation of the first mirror M1, the second mirror M2, the third mirror M3, and the fourth mirror M4 can also be measured. Hence even higher accuracy correction becomes possible.

Furthermore, with the exposure apparatus 10, the construction is such that the exposure light is EUV radiation EL of an approximate circular-arc slit shape, and the pattern on the reticle R is transferred to the wafer W via the projection optical system PO comprising only the reflection type reticle R and the reflection type optical elements. Hence highly accurate transfer of extremely fine patterns, for example patterns where the pitch is from 100 nm to 70 nm, becomes adequately possible. Furthermore, by providing a change correction function for the projection optical system PO in the exposure apparatus 10, then maintenance of the performance can be easily performed.

By using the abovedescribed exposure apparatus 10 and exposure method to transfer a pattern (device pattern) on a reticle R onto a wafer W to thereby manufacture a device, the device pattern is transferred onto the wafer W in a condition with the intrinsic exposure performance of the projection optical system PO maintained. Consequently, devices of a predetermined quality can be stably manufactured.

Here, in the abovementioned embodiment, monitoring with the mirror monitor system 80 is described as being carried out at suitable intervals such as each exposure of one wafer W, or each predetermined time such as each hour or each day. However, for this interval, any interval is suitable for which predetermined exposure performance can be obtained. For example, the construction may be such that real time control is performed by continuously performing monitoring even during the exposure operation. Moreover, the construction may be such that appropriate monitoring is performed irregularly only at necessary times.

Furthermore, with the abovementioned embodiment, the position information for the respective reflection surfaces at all of the mirrors constituting the projection optical system PO is obtained with the mirror monitor system 80. However for example the position information may be obtained for the reflection surface of only one or of a plurality of the mirrors which contribute most to the imaging of the reticle pattern.

Moreover, while the position information for the reflection surface of at least one mirror constituting the projection optical system PO is obtained, in addition to this, or independently, the position information for the reflection surface of at least one mirror constituting the illumination optical system may be obtained in exactly the same manner as for the above embodiment. In short, the position information for the reflection surface of at least one reflection optical element (mirror) arranged between the EUV radiation generating source (for example the EUV radiation generating device 24 inside the light source apparatus 12) and the wafer W may be obtained, and the reflection surface of this at least one reflection optical element adjusted based on the position information.

Here, since the reticle R reflects the EUV radiation EL at the pattern surface thereof, the reticle R also is considered as one of the reflection optical elements. In addition to or independently of the position adjustment of the reticle R in the Z-direction based on the position information obtained from the laser interferometer RIFZ for the pattern face thereof, the pattern face of the reticle R may be adjusted with an actuator or the like similar to the beforementioned correction system CS.

Furthermore, the construction is such that the EUV radiation EL is illuminated in the circular-arc shape illumination area IA. However, if for example the number of mirrors constituting the projection optical system PO is increased, then a rectangular shape illumination area can be obtained. In this case also, a construction the same as above can be applied. However in practice, if the number of mirrors is increased, the reflectivity for the total projection optical system PO drops. Hence the scanning must be slowed down, bringing about a drop in throughput. Consequently, constructing the projection optical system PO with a minimum number of mirrors is preferable.

Furthermore, the laser plasma light source 16 is not limited to a tape target, and other types (for example, a gas jet target) are also acceptable. Moreover, instead of the laser plasma light source 16, SOR may be used Furthermore, with abovementioned embodiment, for the correction system CS for correcting the optical elements, an actuator such as a piezo element was given as an example. However, provided the position, attitude, shape and the like of the optical elements can be corrected to a required accuracy, then the technology is not limited to that described in the aforementioned Japanese Unexamined Patent Application, First Publication No. 9-63923, and other appropriate technology may be adopted.

Moreover, concerning for example deformation of the first mirror M1, the second mirror M2, the third mirror M3, and the fourth mirror M4 in the projection optical system PO, in the case where this can be reliably maintained within a predetermined accuracy range, or where sufficient accuracy can be maintained for exposure performance, then rather than having a construction where the correction system can correct all of the position, the attitude and the shape, for example the construction may be such that this can simply correct only the position of the first mirror M1, the second mirror M2, the third mirror M3, and the fourth mirror M4. In short, the correction system CS may be such as to be able to correct at least one of the position, the attitude and the shape (for example including localized deformation) of the mirrors.

In addition, with the abovementioned embodiment, the construction is such that control is made by the mirror monitor system 80 so that there is no deformation of the first mirror M1, the second mirror M2, the third mirror M3, or the fourth mirror M4. However, the construction may be such that an actuator is controlled so as to give a desired positional relationship. For example, if due to heat irradiation the shape, for example the radius of curvature, of the first mirror M1, the second mirror M2, the third mirror M3, or the fourth mirror M4, changes with the elapse of time, and the data for this rate of change is known for example by experiment or simulation or the like, then the position of the first mirror M1, the second mirror M2, the third mirror M3, and the fourth mirror M4 can be controlled based on position information obtained from the mirror monitor system 80. If there is only curvature change of the first mirror M1, the second mirror M2, the third mirror M3, or the fourth mirror M4, then the performance of the projection optical system PO can be maintained by mutual spatial adjustment of the first mirror M1, the second mirror M2, the third mirror M3, and the fourth mirror M4.

The projection optical system PO may be either of a full reflection system or a reflection-refraction system if it is provided with at least one reflection type optical element. Of course, also the number of optical elements constituting the projection optical system PO is not intended to be limited to the abovementioned construction. The magnification also is not only for a reducing system, but an equal magnification or an enlarging system are also possible.

In the present embodiment, the projection optical system PO in which only the image surface side is telecentric. However an optical system in which both the object surface and the image surface are telecentric can be used. Furthermore, the form of the visual field of the projection optical system PO is optional.

When the exposure wavelength is 13.4 nm, the numerical aperture of the projection optical system PO is preferably in a range of N. A.$\geq$0.1, and more preferably in a range of N. A.$\geq$0.12, and when the exposure wavelength is 11.5 nm, this is preferably in a range of N. A.$\geq$0.08 and more preferably in a range of N. A.$\geq$0.1.

Moreover, as the exposure apparatus 10 a scanning type was given as the example. However the techniques of the present invention may be similarly applied for example to a step-and-repeat type exposure apparatus.

Moreover, the type of exposure apparatus is not limited to one for use in semiconductor manufacture. For example the technology of the present invention can be widely applied to projection exposure apparatus for liquid crystals for transferring a device pattern for a liquid crystal display element or a plasma display or the like to a rectangular glass plate, or to an exposure apparatus for manufacturing thin film magnetic heads and imaging elements (CCD), reticles or masks, or for micro-machining.

Furthermore, the light source used for generating exposure light in the exposure apparatus 10 is not limited to EUV radiation EL and may be an ArF excimer laser (193 nm), a KrF excimer laser (248 nm), a $F_2$ laser (157 nm), an Ar laser, the higher harmonic waves of a YAG laser or a metallic vapor laser, or the higher harmonic waves of a DFB semiconductor laser or the like, in the case where a projection optical system and/or an illumination optical system having at least one reflection type optical element is used for transmitting the radiation.

Moreover, apart from these, other constructions may be adopted provided these are within the claims and do not deviate from the gist of the present invention. Furthermore, the above described constructions may be combined by appropriate selection.

The projection exposure apparatus shown in FIG. 1 can be produced by a method comprising: securing to a frame supported by a plurality of vibration isolation pads, the projection optical system including the plurality of optical elements assembled inside the lens-barrel, and at least one part of the illumination optical system comprising a plurality of optical elements (including optical integrators and the like); respectively performing optical adjustment of the illumination optical system and the projection optical system; wiring and piping to connect the reticle stage and the substrate stage comprising a plurality of mechanical parts; and performing general adjustment such as electrical adjustment, operation confirmation and the like. The production of the exposure apparatus is preferably performed in a clean room where temperature, cleanliness and the like are controlled.

Semiconductor devices are produced through: a step for designing the function and performance of the device, a step for manufacturing a reticle based on the designing step, a step for exposing a pattern of the reticle onto the wafer by means of the exposure apparatus (FIG. 1), a device assembly step (including a dicing process, a bonding process, and a packaging process), and an inspection step.

The contents of the specification, the claims, the drawings, and the abstract disclosed in Japanese Patent Application No. 11-94315 filed on Mar. 31, 1999, are incorporated by reference into the present specification.

What is claimed is:

1. An exposure apparatus which illuminates a pattern formed on a mask with exposure light to transfer said pattern onto a substrate, comprising:
   a projection optical system that has at least one reflection type optical element and guides exposure light from said mask onto said substrate;
   a detection device that detects position information of said reflection type optical element at a position on said reflection type optical element where said exposure light is irradiated; and
   a correction device that corrects said optical element based on said position information.

2. An exposure apparatus according to claim 1, wherein said detection device detects said position information at a plurality of positions with respect to a single reflection type optical element.

3. An exposure apparatus according to claim 1, wherein said mask is a reflecting type mask.

4. An exposure apparatus according to claim 1, wherein said exposure light is extreme ultraviolet radiation, and all optical elements which constitute said projection optical system are reflection type optical elements.

5. An exposure apparatus according to claim 1, wherein said detection device is an interferometer.

6. An exposure apparatus according to claim 5, wherein a measuring beam of said interferometer is irradiated orthogonal to a reflection surface of said optical element.

7. An exposure apparatus according to claim 1, wherein an actuator that corrects a position or shape of said optical element is provided as said correction device.

8. An exposure apparatus according to claim 1, further comprising a movable body arranged on an image surface side of said projection optical system, and a measuring device that measures the optical characteristics of said projection optical system, and wherein said measuring device has a light receiving face arranged on said movable body so as to detect said exposure light.

9. An exposure apparatus according to claim 8, wherein said movable body is a substrate stage that holds said substrate.

10. An exposure apparatus according to claim 8, wherein said measuring device measures at least wave front aberration of the optical characteristics of said projection optical system.

11. An exposure apparatus according to claim 8, wherein said measuring device has a point-diffraction interferometer.

12. An exposure apparatus according to claim 1, further comprising a stage system that relatively moves said substrate with respect to said exposure light irradiated from said projection optical system while synchronously moving said mask with respect to said exposure light, and wherein said exposure apparatus performs scanning exposure of said substrate with said exposure light.

13. A device manufacturing method comprising a step for transferring a device pattern onto a photosensitive substrate using said exposure apparatus according to claim 1.

14. An exposure method comprising:
    illuminating a pattern formed on a mask with exposure light;
    transferring said pattern onto a substrate by way of a projection optical system including at least one reflection type optical element;
    detecting with a detection device position information regarding said reflection type optical element at an irradiation position where said reflection type optical element is irradiated with said exposure light; and
    correcting said optical element with a correction device based on said position information.

15. An exposure method according to claim 14, further comprising:
    detecting a wave front aberration of a transmission light through said projection optical system with an aberration detection device; and
    correcting said optical element with said correction device based on the detection result.

16. A device manufacturing method comprising a step for transferring a device pattern onto a photosensitive substrate using said exposure method according to claim 14.

17. An exposure apparatus which irradiates an exposure beam generated from an illumination source onto a mask and exposes a substrate with said exposure beam via said mask, comprising:
    at least one reflection optical element arranged on a path through which said exposure beam passes; and
    a detection device that irradiates a measuring beam onto a reflection surface of said at least one reflection type optical element and detects positional information of said at least one reflection type optical element, said measuring beam having an incident direction different from that of said exposure beam.

18. An exposure apparatus according to claim 17, wherein said detection device irradiates said measuring beam onto each of a plurality of points within a predetermined region on said reflection surface which is irradiated by said exposure beam, and detects position information for said reflection surfaces at each of said plurality of points.

19. An exposure method comprising:
    irradiating an exposure beam generated from an illumination source onto a mask;
    exposing a substrate with the exposure beam via said mask;
    irradiating a measuring beam onto a reflection surface of at least one reflection type optical element which is arranged on a path through which said exposure beam passes, so that position information regarding at least one point on said reflection surface is detected, said measuring beam having an incident direction different from said exposure beam; and
    detecting position information regarding at least one point on said reflection surface.

20. An exposure apparatus which transfers a predetermined pattern onto a substrate, comprising:
    an optical system arranged in an optical path of an exposure beam based on said predetermined pattern and which guides said exposure beam onto said substrate, said optical system comprising at least one reflection type optical element arranged in the optical path of said exposure beam;
    a reference member arranged at a predetermined position on said exposure apparatus; and
    a detection device that detects relative position information of said reflection type optical element arranged in the optical path of said exposure beam with respect to a reference position determined by said reference member.

21. An exposure apparatus according to claim 20, wherein said detection device has an illumination device which irradiates a measuring beam onto said reference member and said reflection type optical element, and said relative position information is detected based on comparative information of the measuring beam irradiated onto said reference member and the measuring beam irradiated onto said reflection type optical element.

22. An exposure apparatus according to claim 21, wherein said detection device obtains said comparative information by comparing an optical path length of a detection beam irradiated onto said reference member and an optical path length of the measuring beam irradiated onto said reflection type optical element.

23. An exposure apparatus according to claim 21, wherein said optical system has a plurality of reflection type optical elements, said detection device has an illumination device which irradiates said measuring beam onto said reference member, and each of said reflection type optical elements, and relative position information for each of said refection type optical elements is detected based on a comparison of said measuring beam irradiated onto said reference member and said measuring beam irradiated onto each of said reflection type optical elements.

24. A device manufactured using an exposure apparatus according to claim 23.

25. An exposure apparatus according to claim 20, further comprising:
    a correction device that corrects a position of said reflection type optical element based on said relative position information detected by said detection device.

26. An exposure apparatus according to claim 20, wherein said optical system has a plurality of reflection type optical elements, and said detection device detects relative position information with respect to said reference position for each of said reflection type optical elements.

27. A device manufactured using an exposure apparatus according to claim 26.

28. A device manufactured using an exposure apparatus according to claim 20.

29. An exposure method for transferring a predetermined pattern onto a substrate, comprising:

guiding an exposure beam based on said predetermined pattern onto said substrate using an optical system, said optical system having at least one reflection type optical element arranged in an optical path of said exposure beam; and detecting relative position information of said reflection type optical element arranged in the optical path of said exposure beam with respect to a predetermined reference position.

30. An exposure method according to claim 29, wherein detecting said relative position information includes irradiating a measuring beam onto said reference position and said reflection type optical element, and said relative position information is detected based on comparative information of said measuring beam irradiated onto said reference position and said measuring beam irradiated onto said reflection type optical element.

31. An exposure method according to claim 30, further comprising:

comparing said measuring beam irradiated onto said reference position, and said measurement beam irradiated onto said reflection type optical element, wherein an optical path length of a detection beam irradiated onto said reference position and an optical path length of said measuring beam irradiated onto said reflection type optical element are compared.

32. An exposure method according to claim 30, further comprising, when said optical system has a plurality of reflection type optical elements:

irradiating said measuring beam onto said reference position, and each of said reflection type optical elements; and detecting relative position information for each of said refection type optical elements based on comparison of said measuring beam irradiated onto said reference position and said measuring beam irradiated onto each of said reflection type optical elements.

33. A device manufactured by an exposure method according to claim 32.

34. An exposure method according to claim 29, further comprising:

correcting a position of said reflection type optical element based on said relative position information.

35. An exposure method according to claim 29, wherein, when said optical system has a plurality of reflection type optical elements, relative position information for each of said reflection type optical elements is detected with respect to said reference position.

36. A device manufactured by an exposure method according to claim 35.

37. A device manufactured by an exposure method according to claim 29.

38. A manufacturing method for an exposure apparatus which transfers a predetermined pattern onto a substrate, comprising:

arranging an optical system for guiding an exposure beam onto said substrate in the optical path of said exposure beam based on said predetermined pattern, the arranging of said optical system includes arranging at least one reflection type optical element in the optical path of said exposure beam;

providing a reference member at a predetermined position on said apparatus; and providing a detection device for detecting relative position information of said reflection type optical element arranged in the optical path of said exposure beam with respect to a reference position determined from said reference member.

39. A manufacturing method according to claim 38, further comprising:

providing, above said detection device, an illumination device for irradiating a measuring beam onto said reference member and said reflection type optical element; and providing a comparison device which compares said measuring beam irradiated onto said reference member and said measuring beam irradiated onto said reflection type optical element.

40. A manufacturing method according to claim 39, wherein said detection device obtains comparison information by comparing an optical path length of a detection beam irradiated onto said reference member and an optical path length of said measuring beam irradiated onto said reflection type optical element.

41. A manufacturing method according to claim 39, wherein a plurality of reflection type optical elements are provided as said optical system, said detection device irradiates said measuring beam onto said reference member and each of said refection type optical elements, and said relative position information is detected for each of said reflection type optical elements based on comparison of said measuring beam irradiated onto said reference member and said measuring beam irradiated onto each of said reflection type optical elements.

42. A manufacturing method according to claim 38, further comprising:

providing a correction device for correcting a position of said reflection type optical element based on said relative position information detected by said detection device.

43. A manufacturing method according to claim 38, wherein a plurality of reflection type optical elements are provided as said optical system, and said detection device detects relative position information for each of said reflection type optical elements with respect to said reference position.

44. An exposure apparatus which transfers a predetermined pattern onto a substrate, comprising:

an optical system arranged in an optical path of an exposure beam based on said predetermined pattern and which guides said exposure beam onto said substrate, said optical system comprising at least one reflection type optical element arranged in the optical path of said exposure beam;

a reference condition determining device which determines a reference arrangement condition of said optical system including said reflection type optical element based on optical characteristic information of said optical system; and a detection device that detects displacement information from said reference arrangement condition for said reflection type optical element arranged in the optical path of said exposure beam.

45. An exposure apparatus according to claim 44, wherein said reference condition determining device determines said reference arrangement condition by measuring transmission wave front information for said reflection type optical element, and said detection device has an illumination system for irradiating a measuring beam onto a reference member arranged at a predetermined position on the apparatus and said reflection type optical element, and detects said displacement information from said reference arrangement condition based on comparison information of said measuring beam irradiated onto said reference member and said measuring beam irradiated onto said reflection type optical element.

46. An exposure apparatus according to claim 45, wherein said reference condition determining device includes a point-diffraction interferometer.

47. An exposure apparatus according to claim 45, wherein said detection device compares an optical path length of a detection beam irradiated onto a reference position and an optical path length of said measuring beam irradiated onto said reflection type optical element.

48. An exposure apparatus according to claim 45, wherein said optical system has a plurality of reflection type optical elements, and said illumination system of said detection device irradiates said measuring beam onto a reference position, and each of said reflection type optical elements, and said detection device detects relative position information for each of said reflection type optical elements based on comparison of said measuring beam irradiated onto said reference position and said measuring beam irradiated onto each of said reflection type optical elements.

49. A device manufactured using an exposure apparatus according to claim 48.

50. An exposure apparatus according to claim 44, further comprising:

a correction device that corrects a position of said reflection type optical element based on said displacement information.

51. An exposure apparatus according to claim 44, wherein said optical system has a plurality of reflection type optical elements, and said detection device detects displacement information for each of said reflection type optical elements from said reference arrangement condition.

52. A device manufactured using an exposure apparatus according to claim 51.

53. A device manufactured using an exposure apparatus according to claim 44.

54. An exposure method for transferring a predetermined pattern onto a substrate, comprising:

arranging an optical system having at least one reflection type optical element in an optical path of an exposure beam based on said predetermined pattern;

guiding said exposure beam based on said predetermined pattern onto said substrate;

detecting optical characteristic information of said optical system;

determining a reference arrangement condition of said optical system having said reflection type optical element based on the detected optical characteristic information; and detecting displacement information for said reflection type optical element arranged in the optical path of said exposure beam from said reference arrangement condition.

55. An exposure method according to claim 54, wherein:
said reference arrangement condition is determined by measuring transmission wave front information of said reflection type optical element, a measuring beam is irradiated onto a reference position and said reflection type optical element, and displacement information is detected from said reference arrangement condition based on comparison information of said measuring beam irradiated onto said reference position, and said measuring beam irradiated onto said reflection type optical element.

56. An exposure method according to claim 55, wherein said transmission wave front information of said reflection type optical element is measured using a point-diffraction interferometer.

57. An exposure method according to claim 55, wherein said comparison information is information related to a comparison of an optical path length of a detection beam irradiated onto said reference position and an optical path length of said measuring beam irradiated onto said reflection type optical element.

58. An exposure method according to claim 54, further comprising:

correcting a position of said reflection type optical element based on said displacement information.

59. An exposure method according to claim 54, wherein, when said optical system has a plurality of reflection type optical elements, displacement information for each of said reflection type optical elements is detected from said reference arrangement condition.

60. A device manufactured by an exposure method according to claim 59.

61. An exposure method according to claim 54, further comprising, when said optical system has a plurality of reflection type optical elements:

irradiating a measuring beam onto a reference position, and each of said reflection type optical elements; and detecting relative position information for each of said reflection type optical elements based on comparison of said measuring beam irradiated onto said reference position and said measuring beam irradiated onto each of said reflection type optical elements.

62. A device manufactured by an exposure method according to claim 61.

63. A device manufactured by an exposure method according to claim 54.

64. A manufacturing method for an exposure apparatus which transfers a predetermined pattern onto a substrate, comprising:

arranging an optical system for guiding an exposure beam onto said substrate in the optical path of said exposure beam based on said predetermined pattern, said optical system having at least one reflection type optical element arranged in the optical path of said exposure beam;

determining a reference arrangement condition of said optical system having said reflection type optical element, based on optical characteristic information of said optical system; and providing a detection device for detecting displacement information of said reflection type optical element arranged in the optical path of said exposure beam from said reference arrangement condition.

65. A manufacturing method according to claim 64, wherein said reference arrangement condition is determined by measuring transmission wave front information of said reflection type optical element, and said detection device has an illumination system for irradiating a measuring beam onto a reference member arranged at a predetermined position on the apparatus, and said reflection type optical element, and detects displacement information from said reference arrangement condition based on comparison information of said measuring beam irradiated onto said reference member and said measuring beam irradiated onto said reflection type optical element.

66. A manufacturing method according to claim 65, wherein a point diffraction interferometer is selected as said reference condition determining device.

67. A manufacturing method according to claim 65, wherein said detection device compares an optical path length of a detection beam irradiated onto a reference position and an optical path length of said measuring beam irradiated onto said reflection type optical element.

68. A method for manufacturing an exposure device according to claim 65, wherein said optical system comprises a plurality of reflection type optical elements, and said detection device irradiates said measuring beam onto a reference position and each of said reflection type optical elements, and detects relative position information for each of said reflection type optical elements based on a comparison of said measuring beam irradiated onto said reference member and said measuring beam irradiated onto each of said reflection type optical elements.

69. A method for manufacturing an exposure device according to claim 64, further comprising:
providing a correction device for correcting a position of said reflection type optical element based on said displacement information.

70. A method for manufacturing an exposure device according to claim 64, wherein said optical system comprises a plurality of reflection type optical elements, and said detection device detects displacement information for each of said reflection type optical elements from said reference arrangement condition.

71. An exposure method for exposing a substrate to an exposure beam based on a predetermined pattern via an optical system having a plurality of optical elements including at least one reflection type optical element, comprising:
detecting position information for each of said optical elements; and
correcting optical characteristics of said optical system based on the position information detected for each of said optical elements.

72. An exposure method according to claim 71, further comprising:
measuring transmission wave front aberration of the optical system;
determining a reference condition for each of said optical elements based on results of the measurement;
detecting displacement information from said reference condition for each of said optical elements; and
correcting each of said optical elements to said reference condition based on the detected displacement information.

73. An exposure method according to claim 72, wherein said position information for each of said optical elements is detected by irradiating a measuring beam onto each optical element and measuring distance information from a reference position to each of said optical elements.

74. An exposure method according to claim 73, wherein said measuring beam is directed onto each optical element by mirrors corresponding to each of said optical elements.

75. An exposure method according to claim 73, wherein for each of said optical elements, said measuring beam is incident on each of said optical elements from a different direction to the direction of incidence of said exposure beam on each of said optical elements.

76. A device manufactured by an exposure method according to claim 71.

77. An exposure apparatus for exposing a substrate to an exposure beam based on a predetermined pattern via an optical system having a plurality of optical elements including at least one reflection type optical element, comprising:
a detection device which detects position information for each of said optical elements; and
a correction device which is electrically connected to said detection device and to each of said optical elements, and which corrects optical characteristics of said optical system based on the position information detected for each of said optical elements.

78. An exposure apparatus according to claim 77, further comprising:
a determining device which measures transmission wave front aberration of the optical system, and determines a reference condition for each of said optical elements based on results of the measurement,
wherein said detecting device detects displacement information from said reference condition for each of said optical elements, and said correcting device corrects each of said optical elements to said reference condition based on the detected displacement information.

79. An exposure apparatus according to claim 78, wherein said detection device detects said position information for each of said optical elements by irradiating a measuring beam onto each optical element and measuring distance information from a reference position to each of said optical elements.

80. An exposure apparatus according to claim 79, wherein said detection device comprises mirrors corresponding to each of said optical elements, and directs said measuring beam onto each optical element using said mirrors.

81. An exposure apparatus according to claim 79, wherein for each of said optical elements, said measuring beam irradiated by said detection device is incident on each of said optical elements from a different direction to the direction of incidence of said exposure beam on each of said optical elements.

82. A device manufactured using an exposure apparatus according to claim 77.

83. A manufacturing method for an exposure apparatus for exposing a substrate to an exposure beam based on a predetermined pattern via an optical system having a plurality of optical elements including at least one reflection type optical element, comprising:
providing a detection device which detects position information for each of said optical elements; and
electrically connecting a correction device which corrects optical characteristics of said optical system based on the position information detected for each of said optical elements to said detection device and to each of said optical elements.

84. A manufacturing method according to claim 83, further comprising:
providing a reference determining device which measures transmission wave front aberration of said optical system, and determines a reference condition for each of said optical elements based on results of the measurement, wherein said detecting device detects displacement information from said reference condition for each of said optical elements, and said correcting device corrects each of said optical elements to said reference condition based on the detected displacement information.

85. A manufacturing method according to claim 84, wherein said detection device detects said position information for each of said optical elements by irradiating a measuring beam onto each optical element and measures distance information from said reference position to each of said optical elements.

86. A manufacturing method according to claim 85, wherein said detection device has mirrors corresponding to each of said optical elements, and directs said measuring beam onto each optical element using said mirrors.

87. A manufacturing method according to claim 85, wherein for each of said optical elements, said measuring beam is incident on each of said optical elements from a different direction to the direction of incidence of said exposure beam on each of said optical elements.

* * * * *